United States Patent
Chisaka et al.

(10) Patent No.: US 12,379,664 B2
(45) Date of Patent: Aug. 5, 2025

(54) PHOTOSENSITIVE INK COMPOSITION, CURED PRODUCT, DISPLAY PANEL, AND METHOD FOR PRODUCING CURED PRODUCT

(71) Applicant: TOKYO OHKA KOGYO CO., LTD., Kawasaki (JP)

(72) Inventors: Hiroki Chisaka, Kawasaki (JP); Wataru Suzuki, Kawasaki (JP); Koichi Misumi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 410 days.

(21) Appl. No.: 17/756,390

(22) PCT Filed: Nov. 20, 2020

(86) PCT No.: PCT/JP2020/043505
§ 371 (c)(1),
(2) Date: May 24, 2022

(87) PCT Pub. No.: WO2021/106806
PCT Pub. Date: Jun. 3, 2021

(65) Prior Publication Data
US 2022/0404709 A1    Dec. 22, 2022

(30) Foreign Application Priority Data

Nov. 28, 2019    (JP) .................. 2019-215872

(51) Int. Cl.
G03F 7/20    (2006.01)
G03F 7/031    (2006.01)

(52) U.S. Cl.
CPC ............ G03F 7/2018 (2013.01); G03F 7/031 (2013.01)

(58) Field of Classification Search
CPC .......................... G03F 7/2018; G03F 7/031
See application file for complete search history.

(56) References Cited

U.S. PATENT DOCUMENTS

| | | | | |
|---|---|---|---|---|
| 2009/0220770 A1* | 9/2009 | Ueno | ............... | C08F 222/1025 525/328.5 |
| 2011/0074896 A1* | 3/2011 | Yokoi | ............... | B41M 5/0023 522/74 |
| 2011/0121435 A1* | 5/2011 | Mitsukura | ......... | C08G 73/1042 257/632 |
| 2014/0103270 A1* | 4/2014 | Oota | ..................... | G03F 7/0047 430/7 |
| 2014/0363767 A1* | 12/2014 | Murakami | ........... | G03F 7/0007 430/311 |
| 2017/0160636 A1* | 6/2017 | Tadokoro | ............... | C07C 45/46 |
| 2017/0183519 A1 | 6/2017 | Morita et al. | | |
| 2017/0200919 A1 | 7/2017 | Luchinger et al. | | |
| 2018/0171080 A1* | 6/2018 | Namiki | .................... | C09J 11/06 |
| 2019/0071522 A1 | 3/2019 | Obara et al. | | |
| 2019/0218325 A1 | 7/2019 | Sakurada et al. | | |
| 2020/0229538 A1 | 7/2020 | Yoshinaga et al. | | |

FOREIGN PATENT DOCUMENTS

| | | |
|---|---|---|
| CN | 101565472 B | 5/2011 |
| CN | 106459627 A | 2/2017 |
| JP | 2009-120832 A | 6/2009 |
| JP | 2012-233142 A | 11/2012 |
| JP | 2016-074873 A | 5/2016 |
| JP | 2017-021346 A | 1/2017 |
| KR | 10-2017-0039279 A | 4/2017 |
| TW | 2016-20966 A | 6/2016 |
| WO | WO 2015/190037 A1 | 12/2015 |

OTHER PUBLICATIONS

Office Action issued in U.S. Appl. No. 17/756,439, dated Feb. 14, 2025, in 13 pages.

* cited by examiner

*Primary Examiner* — Jonathan Johnson
*Assistant Examiner* — Jayson D Cosgrove
(74) *Attorney, Agent, or Firm* — KNOBBE, MARTENS, OLSON & BEAR, LLP

(57) ABSTRACT

A liquid photosensitive ink composition capable of forming a cured product with a high refractive index and a high transparency, a cured product of the photosensitive ink composition, a display panel having a film consisting of the cured product, and a method for producing the cured product using the photosensitive ink composition. In a photosensitive ink composition including a photopolymerizable compound, and a photopolymerization initiator, a sulfide compound having specific structure and a (meth)acrylate compound having specific structure are used as the photopolymerizable compound, and a phosphine oxide compound and an oxime ester compound are used as the photopolymerization initiator.

14 Claims, No Drawings

PHOTOSENSITIVE INK COMPOSITION, CURED PRODUCT, DISPLAY PANEL, AND METHOD FOR PRODUCING CURED PRODUCT

CROSS-REFERENCE TO RELATED APPLICATIONS

This application is the U.S. National Phase under 35 U.S.C. § 371 of International Application PCT/JP2020/043505, filed Nov. 20, 2020, designating the U.S., and published in Japanese as WO 2021/106806 on Jun. 3, 2021 which claims priority to Japanese Patent Application Nos. 2019-215872 filed Nov. 28, 2019, the entire content of which is incorporated herein by reference.

TECHNICAL FIELD

The present invention relates to a photosensitive ink composition, a cured product of the photosensitive ink composition, a display panel having a film consisting of the cured product, and a method for producing the cured product using the above photosensitive ink composition.

BACKGROUND ART

A highly refractive material has been used to form an optical component. For example, a composition in which metal oxide particles such as titanium dioxide and zirconium oxide are dispersed in an organic component, and a composition including a polymerizable compound exhibiting a high refractive index is used as highly refractive material. As such a highly refractive material, a composition including: metal oxide particles treated with a fluorene compound having a specific structure that includes a hydrolyzable silyl group; a fluorene compound having a specific structure that includes an acryloyl group; a photopolymerization initiator; and an organic solvent is disclosed (see Examples of Patent Document1).

Patent Document 1: Japanese Unexamined Patent Application, Publication No. 2012-233142

DISCLOSURE OF THE INVENTION

Problems to be Solved by the Invention

A cured product with a high refractive index can be produced by curing the composition disclosed in Patent document 1 including: the metal oxide particles treated with the fluorene compound having the specific structure that includes the hydrolyzable silyl group; the fluorene compound having the specific structure that includes the acryloyl group; the photopolymerization initiator; and the organic solvent by exposure to light. However, for the cured product of such composition, there still remains room for improvement from the viewpoint of transparency.

The present invention has been made in view of the above-mentioned problem. An object of the present invention is to provide a liquid photosensitive ink composition capable of forming a cured product with a high refractive index and a high transparency, a cured product of the photosensitive ink composition, a display panel having a film consisting of the cured product, and a method for producing the cured product using the above photosensitive ink composition.

Means for Solving the Problems

The present inventors have found that the above-mentioned problems can be solved by, in a photosensitive ink composition including a photopolymerizable compound (A), and a photopolymerization initiator (C), using a sulfide compound (A1) having specific structure and a (meth)acrylate compound (A2) having specific structure as the photopolymerizable compound (A), and using a phosphine oxide compound (C1) and an oxime ester compound (C2) as the photopolymerization initiator (C), and accomplished the present invention. More specifically, the invention provides the following.

A first aspect of the present invention relates to a photosensitive ink composition including a photopolymerizable compound (A), and a photopolymerization initiator (C), and including a solvent (S) or not including a solvent (S), in which the photopolymerizable compound (A) includes a sulfide compound (A1) represented by the following formula (a-1) and a (meth)acrylate compound (A2) represented by the following formula (a-2), and the photopolymerization initiator (C) includes a phosphine oxide compound (C1) and an oxime ester compound (C2) in combination.

[Chem. 1]

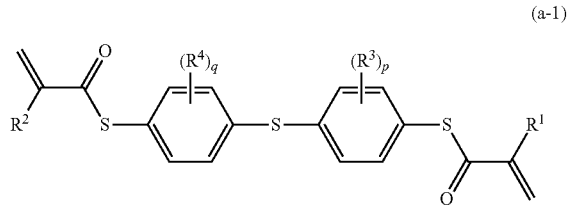

(a-1)

In the formula (a-1), $R^1$ and $R^2$ are each independently a hydrogen atom or a methyl group, $R^3$ and $R^4$ are each independently an alkyl group having 1 or more and 5 or less carbon atoms, and p and q are each independently 0 or 1.

[Chem. 2]

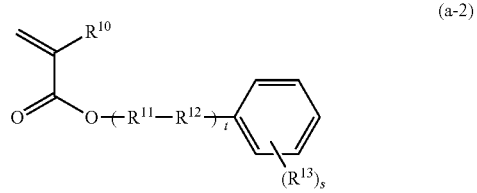

(a-2)

In the formula (a-2), $R^{10}$ is a hydrogen atom or a methyl group, is an alkylene group having 1 or more and 3 or less carbon atoms, $R^{12}$ is a single bond, an oxygen atom, or a sulfur atom, $R^{13}$ is an alkyl group having 1 or more and 4 or less carbon atoms, an alkoxy group having 1 or more and 4 or less carbon atoms, a phenoxy group, or a phenyl group, s is an integer of 0 or more and 5 or less, and t is 0, 1 or 2.

A second aspect of the present invention relates to a cured product of the photosensitive ink composition according to the first aspect.

A third aspect of the present invention relates to a display panel having a film consisting of the cured product according to the second aspect.

A fourth aspect of the present invention relates to a method for producing a cured product including:

shaping the photosensitive ink composition according to the shape of the cured material to be formed, and, exposing the shaped photosensitive ink composition.

Effects of the Invention

The present invention can provide a liquid photosensitive ink composition capable of forming a cured product with a high refractive index and a high transparency, a cured product of the photosensitive ink composition, a display panel having a film consisting of the cured product, and a method for producing the cured product using the above photosensitive ink composition.

PREFERRED MODE FOR CARRYING OUT THE INVENTION

<<Photosensitive Ink Composition>>

A photosensitive ink composition includes a photopolymerizable compound (A), and a photopolymerization initiator (C). The photosensitive ink composition includes or does not include a solvent (S). The photopolymerizable compound (A) includes a sulfide compound (A1) represented by the formula (a-1) described later and a (meth)acrylate compound represented by the formula (a-2) described later. The photopolymerization initiator (C) includes a phosphine oxide compound (C1) and an oxime ester compound in combination.

It should be noted that, in the present claims and the specification, "(meth)acrylate" means both acrylate and methacrylate. In the present claims and the specification, "(meth)acrylic" means both acrylic and methacrylic. In the present claims and the specification, "(meth)acryloyl" means both acryloyl and methacryloyl.

Since the photosensitive ink composition includes the sulfide compound (A1) represented by the formula (a-1), and the (meth)acrylate compound (A2) represented by the formula (a-2) described below in combination, and includes the phosphine oxide compound (C1) and the oxime ester compound (C2) in combination, the cured product with high refractive index and high transparency can be formed by using the photosensitive ink composition.

Hereinafter, essential or optional components that can be included in the photosensitive ink composition are described.

<Photosensitive Ink Composition>

The photosensitive ink composition includes a photopolymerizable compound (A). The photopolymerizable compound (A) includes a sulfide compound (A1) represented by the formula (a-1) described later and a (meth)acrylate compound represented by the formula (a-2) described later.

[Sulfide Compound (A1)]

The sulfide compound (A1) is a compound represented by the following formula (a-1).

[Chem. 3]

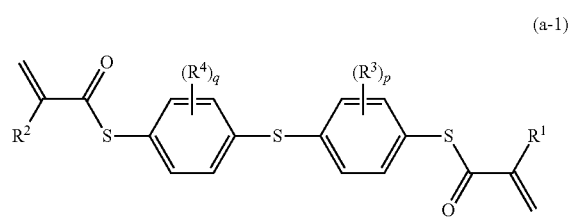

(a-1)

In the formula (a-1), $R^1$ and $R^2$ are each independently a hydrogen atom or a methyl group. $R^3$ and $R^4$ are each independently an alkyl group having 1 or more and 5 or less carbon atoms.

p and q are each independently 0 or 1.

$R^1$ and $R^2$ are each independently a hydrogen atom or a methyl group. $R^1$ and $R^2$ are may be the same or different. $R^1$ and $R^2$ are preferably the same in view of ease of synthesis and availability of the sulfide compound (A1).

$R^3$ and $R^4$ are each independently an alkyl group having 1 or more and 5 or less carbon atoms. $R^3$ and $R^4$ are may be the same or different. $R^3$ and $R^4$ are preferably the same in view of ease of synthesis and availability of the sulfide compound (A1).

The alkyl group having 1 or more and 5 or less carbon atoms as $R^3$ and $R^4$ can be liner or branched. Examples of the alkyl group having 1 or more and 5 or less carbon atoms as $R^3$ and $R^4$ include a methyl group, an ethyl group, an n-propyl group, an isopropyl group, an n-butyl group, an isobutyl group, a sec-butyl group, a tert-butyl group, an n-pentyl group, an isopentyl group, and tert-pentyl group.

Suitable examples of the sulfide compound (A1) include following compounds.

[Chem. 4]

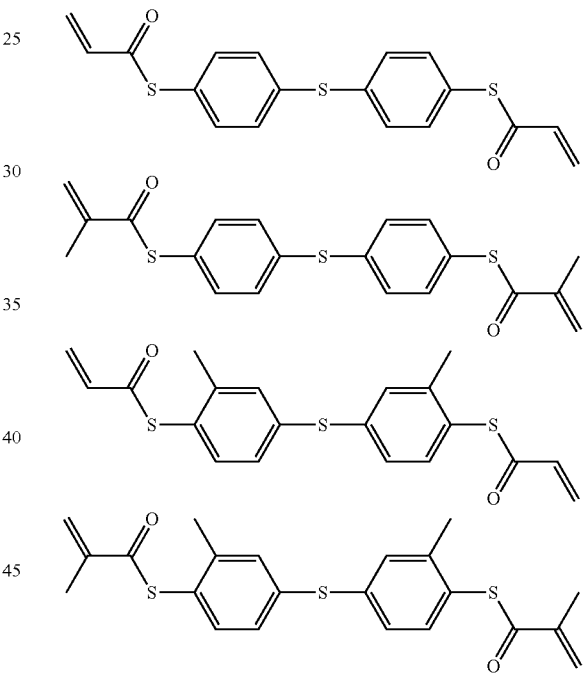

[(Meth)Acrylate Compound (A2)]

The (meth)acrylate compound (A2) is a compound represented by the following formula (a-2).

[Chem. 5]

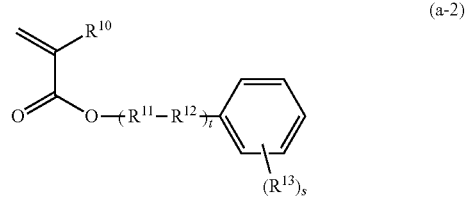

(a-2)

In the formula (a-2), $R^{10}$ is a hydrogen atom or a methyl group. $R^{11}$ is an alkylene group having 1 or more and 3 or less carbon atoms. $R^{12}$ is a single bond, an oxygen atom, or a sulfur atom. $R^{13}$ is an alkyl group having 1 or more and 4 or less carbon atoms, an alkoxy group having 1 or more and 4 or less carbon atoms, a phenoxy group, or a phenyl group. s is an integer of 0 or more and 5 or less. t is 0, 1, or 2.

In the formula (a-2), when t is 2, the plurality of $R^{11}$ may be the same or different, and preferably the same. When t is 2, the plurality of $R^{12}$ may be the same or different, and preferably the same.

$R^{11}$ is an alkylene group having 1 or more ad 3 or less carbon atoms. Specific examples of the alkylene group include a methylene group, an ethane-1,2-diyl group (an ethylene group), an ethane-1,1-diyl group, a propane-1,3-diyl group, a propane-1,2-diyl group, and a propane-2,2-diyl group. Among these, the methylene group, the ethane-1,2-diyl group (the ethylene group), and the propane-1,2-diyl group are preferable, and the ethane-1,2-diyl group (the ethylene group) is more preferable.

$R^{12}$ is a single bond, an oxygen atom, or a sulfur atom, and the single bond is preferable. When $R^{12}$ is the single bond, t is preferably 1.

$R^{13}$ is an alkyl group having 1 or more and 4 or less carbon atoms, an alkoxy group having 1 or more and 4 or less carbon atoms, a phenoxy group, or a phenyl group, and preferably the alkyl group or the alkoxy group having 1 or more and 4 or less carbon atoms in view of low viscosity. Specific examples of the alkyl group include a methyl group, an ethyl group, an n-propyl group, an isopropyl group, an n-butyl group, an isobutyl group, a sec-butyl group, and a tert-butyl group. Among these, the methyl group and the ethyl group are preferable, and the methyl group is more preferable. Specific examples of the alkoxy group include a methoxy group, an ethoxy group, an n-propyloxy group, an isopropyloxy group, an n-butyloxy group, an isobutyloxy group, a sec-butyloxy group, and a tert-butyloxy group. Among these, the methoxy group and the ethoxy group is preferable, and the methoxy group is more preferable. s is an integer of 0 or more and 5 or less, preferably 0 or 1, and more preferably 0.

Suitable examples of the (meth)acrylate compound (A2) include following compounds.

[Chem. 6]

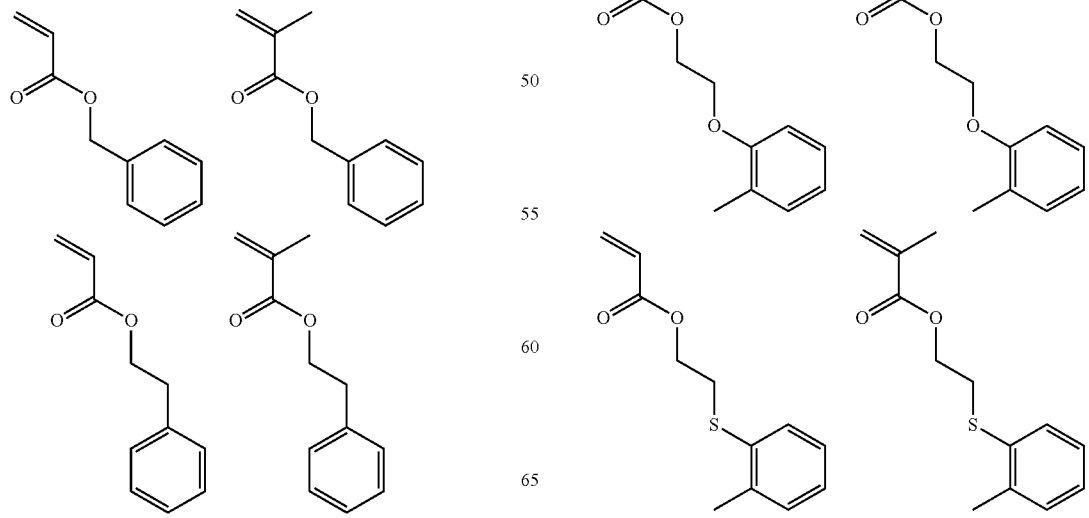

-continued
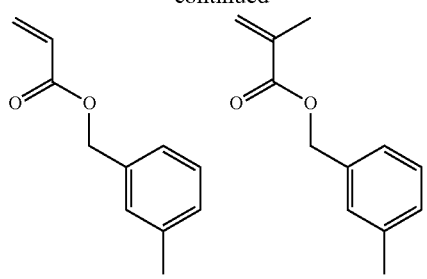
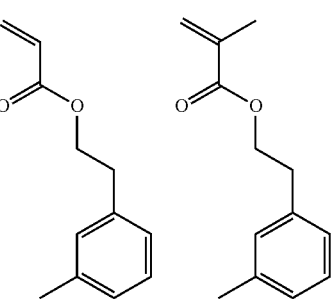
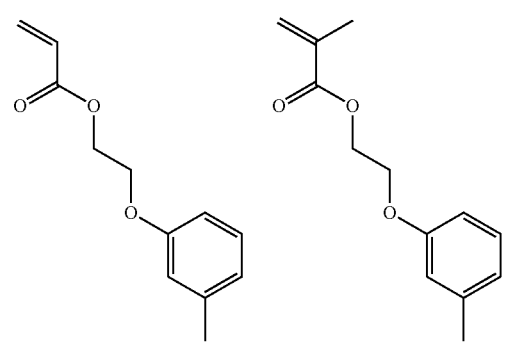
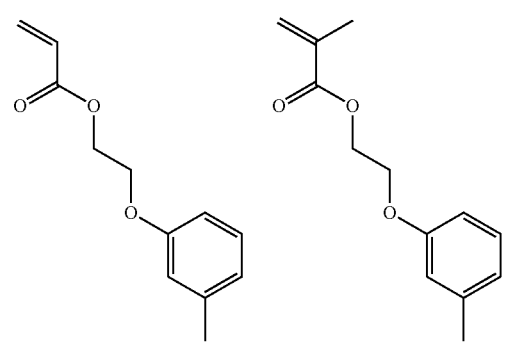
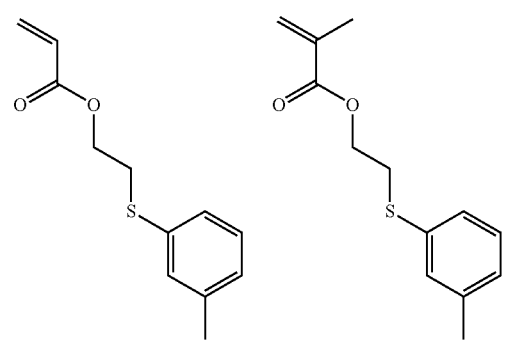
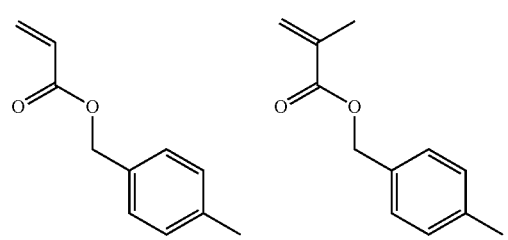
-continued
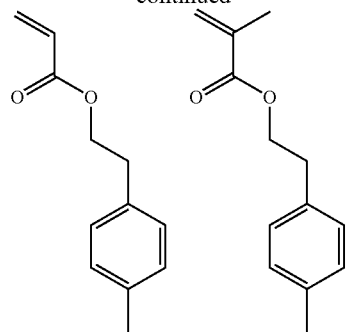
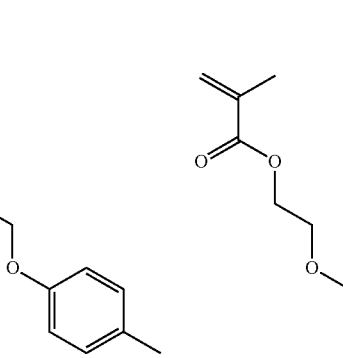
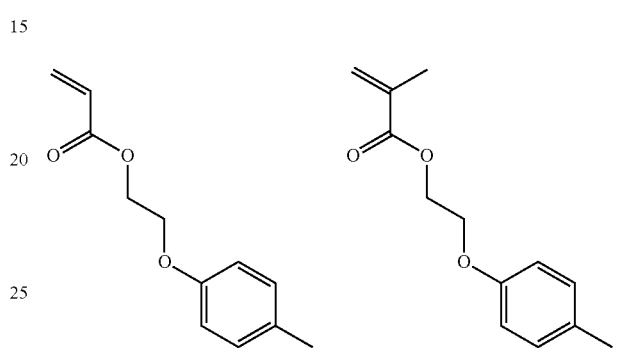
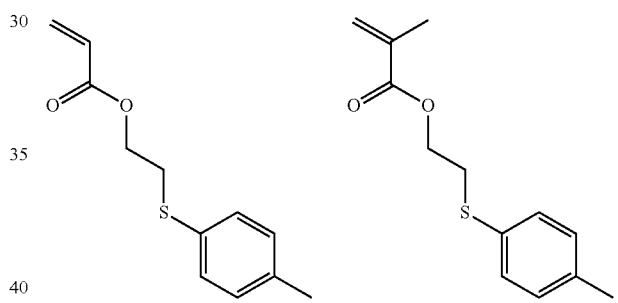
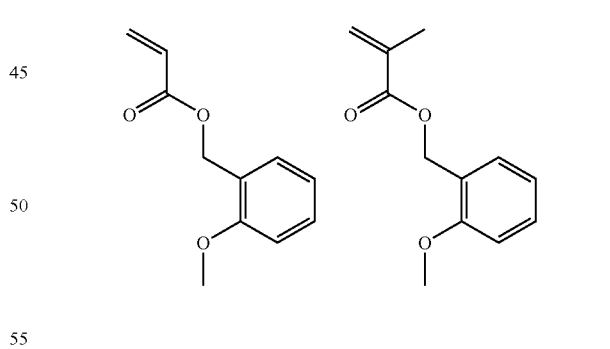

-continued
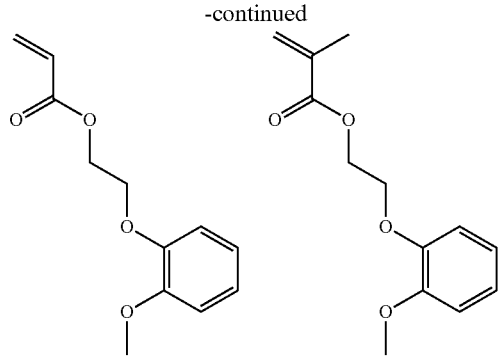
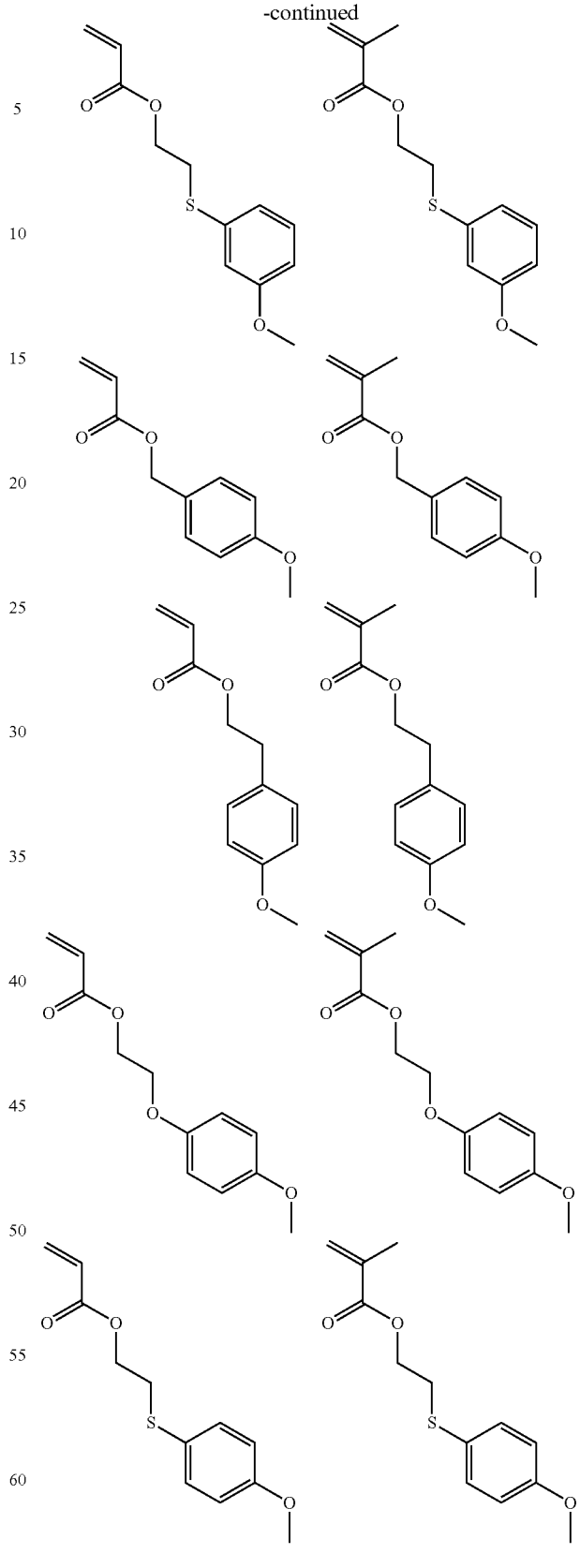
[Other Photopolymerizable Compound (A3)]
The photopolymerizable compound (A) may include other photopolymerizable compound (A3) other than the sulfide compound (A1) and the (meth)acrylate compound (A2) as long as the objective of the present invention is not impaired. Other photopolymerizable compound (A3) is not particularly limited, and conventionally known monofunctional photopolymerizable compound and polyfunctional photopolymerizable compound can be used.

Examples of the monofunctional photopolymerizable compound include (meth)acrylamide, methylol (meth)acrylamide, methoxymethyl(meth)acrylamide, ethoxymethyl (meth)acrylamide, propoxymethyl(meth)acrylamide, butoxymethoxymethyl(meth)acrylamide, N-methylol (meth)acrylamide, N-hydroxymethyl(meth)acrylamide, (meth)acrylic acid, fumaric acid, maleic acid, maleic anhydride, itaconic acid, itaconic anhydride, citraconic acid, citraconic anhydride, crotonic acid, 2-acrylamide-2-methylpropanesulfonic acid, tert-butylacrylamide sulfonic acid, methyl (meth)acrylate, ethyl (meth)acrylate, butyl (meth)acrylate, 2-ethylhexyl (meth)acrylate, cyclohexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, glycerol mono(meth)acrylate, tetrahydrofurfuryl (meth)acrylate, dimethylamino(meth)acrylate, glycidyl (meth)acrylate, 2,2,2-trifluoroethyl(meth)acrylate, 2,2,3,3-tetrafluoropropyl (meth)acrylate, and half (meth)acrylates of phthalic acid derivatives. These monofunctional p photopolymerizable compounds may be used individually, or two or more thereof may be used in combination.

Examples of the polyfunctional photopolymerizable compound include polyfunctional monomers such as ethylene glycol di(meth)acrylate, diethylene glycol di(meth)acrylate, tetraethylene glycol di(meth)acrylate, propylene glycol di(meth)acrylate, polypropylene glycol di(meth)acrylate, butylene glycol di(meth)acrylate, neopentyl glycol di(meth)acrylate, 1,6-hexane glycol di(meth)acrylate, trimethylolpropane tri(meth)acrylate, glycerol di(meth)acrylate, pentaerythritol triacrylate, pentaerythritol tetraacrylate, dipentaerythritol pentaacrylate, dipentaerythritol hexaacrylate, pentaerythritol di(meth)acrylate, pentaerythritol tri(meth)acrylate, pentaerythritol tetra(meth)acrylate, dipentaerythritol penta(meth)acrylate, dipentaerythritol hexa(meth)acrylate, 2,2-bis(4-(meth)acryloxydiethoxyphenyl)propane, 2,2-bis(4-(meth)acryloxypolyethoxyphenyl)propane, 2-hydroxy-3-(meth)acryloyloxypropyl (meth)acrylate, ethylene glycol diglycidyl ether di(meth)acrylate, diethylene glycol diglycidyl ether di(meth)acrylate, phthalic acid diglycidyl ester di(meth)acrylate, glycerol triacrylate, glycerol polyglycidyl ether poly(meth)acrylate, urethane (meth)acrylate (in other words, a tolylene diisocyanate), reaction product of, trimethylhexamethylene diisocyanate, hexamethylene diisocyanate, and 2-hydroxyethyl (meth)acrylate, methylenebis(meth)acrylamide, (meth)acrylamide methylene ether, condensates of a polyhydric alcohol and N-methylol (meth)acrylamide, triacrylformal, and the like. These polyfunctional p photopolymerizable compounds may be used individually, or two or more thereof may be used in combination.

The ratio of the sum of the mass of the sulfide compound (A1) and the mass of the (meth)acrylate compound (A2) relative to the mass of the photopolymerizable compound (A) is preferably 80% by mass or more, more preferably 90% by mass or more, further preferably 95% by mass or more, and most preferably 100% by mass. The ratio of the mass of the sulfide compound (A1) relative to the mass of the photosensitive ink composition excluding the mass of the solvent (S) is preferably 5% by mass or more and 30% by mass or less, more preferably 7% by mass ore more and 25% by mass or less, and further preferably 9% by mass or more and 20% by mass or less. The ratio of the mass of the (meth)acrylate compound (A2) relative to the mass of the photosensitive ink composition excluding the mass of the solvent (S) is preferably 10% by mass or more and 50% by mass or less, more preferably 20% by mass ore more and 45% by mass or less, and further preferably 30% by mass or more and 40% by mass or less. When the photopolymerizable compound (A) includes the sulfide compound (A1) and the (meth)acrylate compound (A2) in an amount within the above range, the photosensitive ink composition is highly photocurable and has low viscosity, and the cured product with a high refractive index can be formed by using the photosensitive ink composition. In addition, a ratio (MA1:MA2) of the mass MA1 of the sulfide compound (A1) to the mass MA2 of the (meth)acrylate compound is preferably from 1:99 to 59:41, more preferably from 5:95 to 55:45, further preferably from 10:90 to 53:47, and particularly preferably from 15:85 to 50:50, in view of balance of refractive index of the cured product, photocurability, and viscosity.

It is preferable that the mass of the (meth)acrylate compound (A2) is more than the mass of the sulfide compound (A1), since, the cured product with high refractive index is easily formed by using the photosensitive ink composition.

[Metal Compound Particles (B)]

The photosensitive ink composition preferably includes metal compound particles (B). The metal compound particles (B) are at least one selected from the group consisting of titanium oxide particles, barium titanate particles, cerium oxide particles, and zinc sulfide particles. The photosensitive ink composition may include one of these metal compound particles (B) alone, or two or more thereof in combination. When the photosensitive ink composition includes the above metal compound particles, the cured product with high refractive index can be particularly easily formed.

In view of transparency of the cured product, an average particle diameter of the metal compound particles (B) is preferably 500 nm or smaller, and more preferably 2 nm or larger and 100 nm or smaller.

A content of the metal compound particles (B) in the photosensitive ink composition is not particularly limited as long as the objective of the present invention is not impaired. The content of the metal compound particles (B) in the photosensitive ink composition is preferably 5% by mass or more and 70% by mass or less, more preferably 35% by mass or more and 70% by mass or less, and further preferably 45% by mass or more and 60% by mass or less relative to the mass of the photosensitive ink composition excluding a mass of the solvent (S). When the content of the metal compound particles (B) in the photosensitive ink composition is within the above range, it is easy to obtain the photosensitive ink composition with low viscosity even when the photosensitive ink composition does not include the solvent (S), and to form the cured product with high refractive index.

<Photopolymerization Initiator (C)>

The photosensitive ink composition includes a phosphine oxide compound (C1) and an oxime ester compound as a photopolymerization initiator (C). By using the photopolymerization initiator (C), a cured product with a high refractive index and a high transparency can be formed by using the photosensitive ink composition. The photopolymerization initiator (C) including the phosphine oxide compound (C1) and the oxime ester compound (C2) in combination contributes in particular to transparency of cured product.

The photosensitive ink composition may include other photopolymerization initiator (C3) other than the phosphine oxide compound (C1) and the oxime ester compound (C2) as long as the objects of the present invention are not inhibited. In view of easily obtaining a desired effect, a ratio of sum of a mass of the phosphine oxide compound (C1) and a mass of the oxime ester compound (C2) is preferably 80% by mass or more, more preferably 90% by mass or more, further preferably 95% by mass or more, and particularly preferably 100% by mass relative to a mass of the photopolymerization initiator (C)

[Phosphine Oxide Compound (C1)]

The phosphine oxide compound (C1) is a pentavalent phosphorus compound having P=O bond. As the phosphine oxide compound (C2), a pentavalent phosphorous compound conventionally used as a photopolymerization initiator and having a P=O bond can be used without any particular limitation. Examples of the phosphine oxide compound include a compound represented by the following formula (c-I).

[Chem. 7]

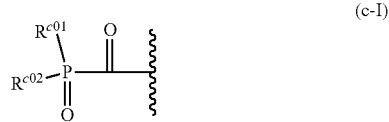

(c-I)

In the formula (c-I), $R^{c01}$ and $R^{c02}$ are each independently an alkyl group, a cycloalkyl group, an aryl group, an aliphatic acyl group having 2 or more and 20 or less carbon atoms, or an aromatic acyl group having 7 or more and 20 or less carbon atoms. However, both $R^{c01}$ and $R^{c02}$ cannot be the aliphatic acyl group or the aromatic acyl groups.

The number of carbon atoms of the alkyl group as $R^{c01}$ and $R^{c02}$ is preferably 1 or more and 12 or less, more preferably 1 or more and 8 or less, and further preferably 1 or more and 4 or less. The alkyl group as $R^{c01}$ and $R^{c02}$ can be liner or branched. Specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, a 2,4,4-trimethylpentyl group, a 2-ethylhexyl group, an n-nonyl group, an n-decyl group, an n-undecyl group, and an n-dodecyl group.

The number of carbon atoms of the cycloalkyl group as $R^{c01}$ and $R^{c02}$ is preferably 5 or more and 12 or less. Specific examples of the cycloalkyl group include a cyclopentyl group, a cyclohexyl group, a cycloheptyl group, a cyclooctyl group, a cyclononyl group, a cyclodecyl group, a cycloundecyl group, and a cyclododecyl group.

The number of carbon atoms of the aryl group as $R^{c01}$ and $R^{c02}$ is preferably 6 or more and 12 or less. The aryl group may have a substituent. Examples of the substituent include a halogen atom, an alkyl group having 1 or more and 4 or less carbon atoms, an alkoxy group having 1 or more and 4 or less carbon atoms, and the like. Specific examples of the aryl group include a phenyl group and a naphthyl group.

The number of carbon atoms of the aliphatic acyl group as $R^{c01}$ and $R^{c02}$ is 2 or more and 20 or less, preferably 2 or more and 12 or less, more preferably 2 or more and 8 or less, and further preferably 2 or more and 6 or less. The aliphatic acyl group can be liner or branched. Specific examples of the aliphatic acyl group include an acetyl group, a propionyl group, a butanoyl group, a pentanoyl group, a hexanoyl group, a heptanoyl group, an octanoyl group, a nonanoyl group, a decanoyl group, an undecanoyl group, a dodecanoyl group, a tridecanoyl group, a tetradecanoyl group, a pentadecanoyl group, a hexadecanoyl group, a heptadecanoyl group, an octadecanoyl group, a nonadecanoyl group, and an icosanoyl group.

The number of carbon atoms of the aromatic acyl group as $R^{c01}$ and $R^{c02}$ is 7 or more and 20. The aromatic acyl group may have a substituent. Examples of the substituent include a halogen atom, an alkyl group having 1 or more and 4 or less carbon atoms, an alkoxy group having 1 or more and 4 or less carbon atoms, and the like. Specific examples of the aromatic acyl group include a benzoyl group, an o-tolyl group, a m-tolyl group, a p-tolyl group, a 2,6-dimethylbenzoyl group, a 2,6-dimethoxybenzoyl group, a 2,4,6-trimethylbenzoyl group, an α-naphthoyl group, and a β-naphthoyl group.

Specific examples of the phosphine oxide compound having the partial structure represented by the formula (c-I) include 2,4,6-trimethylbenzoyldihenylphosphin oxide, bis(2,4,6-trimethylbenzoyl)-phenylphosphine oxide, and bis(2,6-dimethoxybenzoyl)-2,4,4-trimethyl-pentylphosphine oxide.

[Oxime Ester Compound (C2)]

The oxime ester compound (C2) is a compound having a bond represented by >C=N—O—CO—. As the oxime ester compound (C2), a compound conventionally used as a photopolymerization initiator and having a bond represented by >C=N—O—CO— can be used without any particular limitation.

When only the oxime ester compound (C2) is used as the photopolymerization initiator (C), formation of the cured product with sufficiently high transparency is often difficult. On the other hand, when the oxime ester compound (C2) is used with the phosphine oxide compound in combination, the cured product with high transparency can be easily formed.

The oxime ester compound (C2) is preferably a compound that does not include a compound having a peak in a wavelength range of 320 nm or longer and 400 nm or shorter in the absorption spectrum and showing a gram absorption coefficient of 10 or more at any one or more wavelength in the wavelength range of 400 nm or longer. In this case, the cured product with particularly good transparency is easily formed.

[Chem. 8]

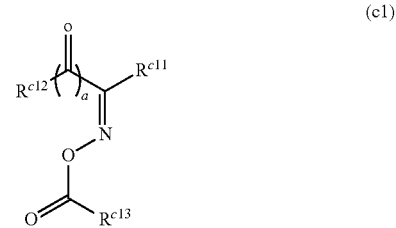

(c1)

In the formula (C1), $R^{c11}$ represents an optionally substituted alkyl group having 1 or more and 10 or less carbon atom, an optionally substituted phenyl group, or an optionally substituted carbazolyl group. a is 0 or 1. $R^{c12}$ represents an optionally substituted alkyl group having 1 or more and 10 or less carbon atom, an optionally substituted phenyl group, or an optionally substituted carbazolyl group. $R^{c13}$ represents a hydrogen atom, an alkyl group having 1 or more and 6 or less carbon atoms, or an optionally substituted phenyl group.

When $R^{c11}$ is the alkyl group having 1 or more and 10 or less carbon atoms, type of a substituent possessed by the alkyl group is not particularly limited as long as the objects of the present invention are not inhibited.

Examples of suitable substituents which the alkyl group having 1 or more and 10 or less carbon atoms may have include an alkoxy group having 1 or more and 20 or less carbon atoms, a cycloalkyl group having 3 or more and 10 or less carbon atoms, a cycloalkoxy group having 3 or more and 10 or less carbon atoms, a saturated aliphatic acyl group having 2 or more and 20 or less carbon atoms, an alkoxycarbonyl group having 2 or more and 20 or less carbon atoms, a saturated aliphatic acyloxy group having 2 or more and 20 or less carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 or more and 20 or less carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 or more and 20 or less carbon atoms, an optionally substituted heterocyclyl group, an optionally substituted heterocyclylcarbonyl group, an amino group, an amino group substituted with 1 or 2 organic groups, a morpholine-1-yl group, a piperazine-1-yl group, halogen, a nitro group, a cyano group and the like.

The alkyl group having 1 or more and 10 or less carbon atoms may be linear or branched. In this case, the number of carbon atoms of the alkyl group is preferably 1 or more and 8 or less, and more preferably 1 or more and 5 or less.

When $R^{c11}$ is an optionally substituted phenyl group, the type of the substituent is not particularly limited as long as the objects of the present invention are not inhibited. Examples of a suitable substituent that the phenyl group may have include an alkyl group, an alkoxy group, an cycloalkyl group, an cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with one or two organic groups, a morpholin-1-yl group, a piperazin-1-yl group, a halogen, a nitro group, a cyano group, and the like. When Roll is an optionally substituted phenyl group and the phenyl group has a plurality of substituents, the plurality of substituents may be the same as or different from each other.

When a substituent of the phenyl group is an alkyl group, the number of carbon atoms of the alkyl group is preferably 1 or more and 20 or less, more preferably 1 or more and 10 or less, further preferably 1 or more and 6 or less, particularly preferably 1 or more and 3 or less, and most preferably 1. The alkyl group may be linear or branched. When a substituent of the phenyl group is an alkyl group, specific examples thereof include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. The alkyl group may have an ether bond (—O—) in the carbon chain. In this case, examples of a substituent of the phenyl group include an alkoxyalkyl group and an alkoxyalkoxyalkyl group. When a substituent of the phenyl group is an alkoxyalkyl group, a group represented by —$R^{c14}$—O—$R^{c15}$ is preferable. $R^{c14}$ represents a linear or branched alkylene group having 1 or more and 10 or less carbon atoms. $R^{c15}$ represents a linear or branched alkyl group having 1 or more and 10 or less carbon atoms. The number of carbon atoms of $R^{c14}$ is preferably 1 or more and 8 or less, more preferably 1 or more and 5 or less, and particularly preferably 1 or more and 3 or less. The number of carbon atoms of $R^{c15}$ is preferably 1 or more and 8 or less, more preferably 1 or more and 5 or less, particularly preferably 1 or more and 3 or less, and most preferably 1. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group, and the like.

When a substituent of the phenyl group is an alkoxy group, the number of carbon atoms of the alkoxy group is preferably 1 or more and 20 or less, and more preferably 1 or more and 6 or less. The alkoxy group may be linear or branched. When a substituent of the phenyl group is an alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group, and the like. The alkoxy group may include an ether bond (—O—) in the carbon chain. Examples of the alkoxy group having an ether bond in the carbon chain include a methoxyethoxy group, an ethoxyethoxy group, a 2-methoxy-1-methylethoxy group, a methoxyethoxyethoxy group, an ethoxyethoxyethoxy group, a propyloxyethoxyethoxy group, a methoxypropyloxy group, and the like.

When a substituent of the phenyl group is a cycloalkyl group or a cycloalkoxy group, the number of carbon atoms of the cycloalkyl group or the cycloalkoxy group is preferably 3 or more and 10 or less, and more preferably 3 or more and 6 or less. When a substituent of the phenyl group is a cycloalkyl group, specific examples thereof include a cyclopropyl group, a cyclobutyl group, a cyclopentyl group, a cyclohexyl group, a cycloheptyl group, a cyclooctyl group, and the like. When a substituent of the phenyl group is a cycloalkoxy group, specific examples include a cyclopropyloxy group, a cyclobutyloxy group, a cyclopentyloxy group, a cyclohexyloxy group, a cycloheptyloxy group, a cyclooctyloxy group, and the like.

When a substituent of the phenyl group is a saturated aliphatic acyl group or a saturated aliphatic acyloxy group, the number of carbon atoms of the saturated aliphatic acyl group or the saturated aliphatic acyloxy group is preferably 2 or more and 20 or less, and more preferably 2 or more and 7 or less. When a substituent of the phenyl group is a saturated aliphatic acyl group, specific examples thereof include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group, and the like. When a substituent of the phenyl group is a saturated aliphatic acyloxy group, specific examples thereof include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group, and the like.

When a substituent of the phenyl group is an alkoxycarbonyl group, the number of carbon atoms of the alkoxycarbonyl group is preferably 2 or more and 20 or less, and more preferably 2 or more and 7 or less. When a substituent of the phenyl group is an alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group, and the like.

When a substituent of the phenyl group is a phenylalkyl group, the number of carbon atoms of the phenylalkyl group is preferably 7 or more and 20 or less, more preferably 7 or more and 10 or less. When a substituent of the phenyl group is a naphthylalkyl group, the number of carbon atoms of the naphthylalkyl group is preferably 11 or more and 20 or less, more preferably 11 or more and 14 or less. When a substituent of the phenyl group is a phenylalkyl group, specific examples thereof include a benzyl group, a 2-phenylethyl group, a 3-phenylpropyl group, and a 4-phenylbutyl group. When a substituent of the phenyl group is a naphthylalkyl group, specific examples include an α-naphthylmethyl group, a β-naphthylmethyl group, a 2-(α-naphthyl)ethyl group, and a 2-(β-naphthyl)ethyl group. When a substituent of the phenyl group is a phenylalkyl group or a naphthylalkyl group, the substituent may further have a substituent on the phenyl group or the naphthyl group.

When a substituent of the phenyl group is a heterocyclyl group, the heterocyclyl group is a 5- or 6-membered monocycle including one or more N, S, and O, or a heterocyclyl group in which these monocycles are condensed with each other, or the monocycle and a benzene ring are condensed. When the heterocyclyl group is a condensed ring, the number of rings constituting the condensed ring is 3 or less. Examples of the heterocycle constituting the heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, and the like. When a substituent of the phenyl group is a heterocyclyl group, the heterocyclyl group may further have a substituent.

When a substituent of the phenyl group is an amino group substituted with one or two organic groups, suitable examples of the organic group include an alkyl group having 1 or more and 20 or less carbon atoms, a cycloalkyl group having 3 or more and 10 or less carbon atoms, a saturated aliphatic acyl group having 2 or more and 20 or less carbon atoms, a saturated aliphatic acyloxy group having 2 or more and 20 or less carbon atoms, an optionally substituted phenyl group, an optionally substituted benzoyl group, an optionally substituted phenylalkyl group having 7 or more and 20 or less carbon atoms, an optionally substituted naphthyl group, an optionally substituted naphthoyl group, an optionally substituted naphthylalkyl group having 11 or more and 20 or less carbon atoms, a heterocyclyl group, and the like. Specific examples of suitable organic groups are the same as the groups described above as the substituent of the phenyl group. Specific examples of the amino group substituted with one or two organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoylamino group, an n-hexanoylamino group, an n-heptanoylamino group, an n-octanoylamino group, an n-decanoylamino group, a benzoylamino group, an α-naphthoylamino group, a β-naphthoylamino group, an N-acetyl-N-acetyloxyamino group, and the like.

When a phenyl group, a naphthyl group, and a heterocyclyl group included in a substituent of the phenyl group further have a substituent, examples of the further substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group which has an alkyl group having 1 or more and 6 or less carbon atoms, a dialkylamino group which has an alkyl group having 1 or more and 6 or less carbon atoms, a morpholin-1-yl group, a piperazin-1-yl group, halogen, a nitro group, a cyano group, and the like. When a phenyl group, a naphthyl group, and a heterocyclyl group included in a substituent of the phenyl group further have a substituent, the number of further substituents is not particularly limited as long as the object of the present invention is not inhibited, and is preferably 1 or more and 4 or less. When a phenyl group, a naphthyl group, and a heterocyclyl group included in a substituent of the phenyl group have a plurality of substituents, the plurality of substituents may be the same as or different from each other.

Substituents for the case in which Ro11 is an optionally substituted phenyl group are described above. Among those substituents, an alkyl group or an alkoxyalkyl group is preferable.

When $R^{o11}$ is an optionally substituted phenyl group, neither the number of substituents nor the position to which a substituent is bonded is particularly limited as long as the objects of the present invention are not inhibited. When Roll is an optionally substituted phenyl group, the optionally substituted phenyl group is preferably an optionally substituted o-tolyl group for excellent efficiency of base generation.

When $R^{c11}$ is an optionally substituted carbazolyl group, the type of the substituent is not particularly limited as long as the objects of the present invention are not inhibited. Examples of a suitable substituent that the carbazolyl group may have on a carbon atom include an alkyl group having 1 or more and 20 or less carbon atoms, an alkoxy group having 1 or more and 20 or less carbon atoms, a cycloalkyl group having 3 or more and 10 or less carbon atoms, a cycloalkoxy group having 3 or more and 10 or less carbon atoms, a saturated aliphatic acyl group having 2 or more and 20 or less carbon atoms, an alkoxycarbonyl group having 2 or more and 20 or less carbon atoms, a saturated aliphatic acyloxy group having 2 or more and 20 or less carbon atoms, an optionally substituted phenyl group, an optionally substituted phenoxy group, an optionally substituted phenylthio group, an optionally substituted phenylcarbonyl group, an optionally substituted benzoyl group, an optionally substituted phenoxycarbonyl group, an optionally substituted benzoyloxy group, an optionally substituted phenylalkyl group having 7 or more and 20 or less carbon atoms, an optionally substituted naphthyl group, an optionally substituted naphthoxy group, an optionally substituted naphthylcarbonyl group, an optionally substituted naphthoyl group, an optionally substituted naphthoxycarbonyl group, an optionally substituted naphthoyloxy group, an optionally substituted naphthylalkyl group having 11 or more and 20 or less carbon atoms, an optionally substituted heterocyclyl group, an optionally substituted heterocyclylcarbonyl group, an amino group, an amino group substituted with one or two organic groups, a morpholin-1-yl group, a piperazin-1-yl group, a halogen, a nitro group, and a cyano group.

When $R^{c11}$ is an optionally substituted carbazolyl group, examples of a suitable substituent that the carbazolyl group may have on the nitrogen atom include an alkyl group having 1 or more and 20 or less carbon atoms, a cycloalkyl group having 3 or more and 10 or less carbon atoms, a saturated aliphatic acyl group having 2 or more and 20 or less carbon atoms, an alkoxycarbonyl group having 2 or more and 20 or less carbon atoms, an optionally substituted phenyl group, an optionally substituted benzoyl group, an optionally substituted phenoxycarbonyl group, an optionally substituted phenylalkyl group having 7 or more and 20 or less carbon atoms, an optionally substituted naphthyl group, an optionally substituted naphthoyl group, an optionally substituted naphthoxycarbonyl group, an optionally substituted naphthylalkyl group having 11 or more and 20 or less carbon atoms, an optionally substituted heterocyclyl group, and an optionally substituted heterocyclylcarbonyl group. Among these substituents, an alkyl group having 1 or more and 20 or less carbon atoms is preferable, an alkyl group having 1 or more and 6 or less carbon atoms is more preferable, and an ethyl group is particularly preferable.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group, and an amino group substituted with one or two organic groups, specific examples of the substituent that the carbazolyl group may have are the same as the examples of a substituent of the phenyl group when $R^{c11}$ is an optionally substituted phenyl group.

For $R^{c11}$, when a phenyl group, a naphthyl group, and a heterocyclyl group in a substituent of the carbazolyl group further have a substituent, examples of the further substituent include an alkyl group having 1 or more and 6 or less carbon atoms; an alkoxy group having 1 or more and 6 or less carbon atoms; a saturated aliphatic acyl group having 2 or more and 7 or less carbon atoms; an alkoxycarbonyl group having 2 or more and 7 or less carbon atoms; a saturated aliphatic acyloxy group having 2 or more and 7 or less carbon atoms; a phenyl group; a naphthyl group; a benzoyl group; a naphthoyl group; a benzoyl group substituted with a group selected from the group consisting of an alkyl group having 1 or more and 6 or less carbon atoms, a morpholin-1-yl group, a piperazin-1-yl group, and a phenyl group; a monoalkylamino group having an alkyl group having 1 or more and 6 or less carbon atoms; a dialkylamino group having an alkyl group having 1 or more and 6 or less carbon atoms; a morpholin-1-yl group; a piperazin-1-yl group; a halogen; a nitro group; and a cyano group. When a phenyl group, a naphthyl group, and a heterocyclyl group in a substituent of the carbazolyl group further have a substituent, the number of further substituents is not limited as long as the objects of the present invention are not inhibited, and is preferably 1 or more and 4 or less. When the phenyl group, the naphthyl group, and the heterocyclyl group have a plurality of substituents, the plurality of substituents may be the same as or different from each other.

$R^{c12}$ represents an optionally substituted alkyl group having 1 or more and 10 or less carbon atoms, an optionally substituted phenyl group, or an optionally substituted carbazolyl group.

When $R^{c12}$ is an optionally substituted alkyl group having 1 or more and 10 or less carbon atoms, the alkyl group may be linear or branched. In this case, the number of carbon atoms of the alkyl group is preferably 1 or more and 8 or less, and more preferably 1 or more and 5 or less.

For $R^{c12}$, there is no particular limitation for substituents on the alkyl group, or the phenyl group as long as the object of the present invention is not inhibited. Examples of suitable substituents which the alkyl group may have on the carbon atom include an alkoxy group having 1 or more and 20 or less carbon atoms, a cycloalkyl group having 3 or more and 10 or less carbon atoms, a cycloalkoxy group having 3 or more and 10 or less carbon atoms, a saturated aliphatic acyl group having 2 or more and 20 or less carbon atoms, an alkoxycarbonyl group having 2 or more and 20 or less carbon atoms, a saturated aliphatic acyloxy group having 2 or more and 20 or less carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 or more and 20 or less carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 or more and 20 or less carbon atoms, an optionally substituted heterocyclyl group, an optionally substituted heterocyclylcarbonyl group, an amino group, an amino group substituted with one or two organic groups, a morpholin-1-yl group, a piperazin-1-yl group, halogen, a nitro group, a cyano group and the like. Examples of a suitable substituent that the phenyl group may have on a carbon atom include the above examples of groups as a suitable substituent that the alkyl group may have on a carbon atom and an alkyl group having 1 or more and 20 or less carbon atoms.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group and an amino group substituted with one or two organic groups, specific examples of optional substituents on the alkyl group, or the phenyl group are the same as the examples of a substituent of the phenyl group when Roll is an optionally substituted phenyl group.

In a case where the phenyl group, the naphthyl group and the heterocyclyl group included in the substituent on the alkyl group or the phenyl group in $R^{c12}$ further have a substituent, examples of the further substituent include an alkyl group having 1 or more and 6 or less carbon atoms; an alkoxy group having 1 or more and 6 or less carbon atoms; a saturated aliphatic acyl group having 2 or more and 7 or less carbon atoms; an alkoxycarbonyl group having 2 or more and 7 or less carbon atoms; a saturated aliphatic acyloxy group having 2 or more and 7 or less carbon atoms; a phenyl group; a naphthyl group; a benzoyl group; a naphthoyl group; a benzoyl group substituted with a group selected from the group consisting of an alkyl group having 1 or more and 6 or less carbon atoms, a morpholin-1-yl group, a piperazin-1-yl group and a phenyl group; a monoalkylamino group having an alkyl group having 1 or more and 6 or less carbon atoms; a dialkylamino group having an alkyl group having 1 or more and 6 or less carbon atoms; a morpholin-1-yl group; a piperazin-1-yl group; halogen; a nitro group; and a cyano group. In a case where the phenyl group, the naphthyl group and the heterocyclyl group included in the substituent on the alkyl group or the phenyl group further have a substituent, the number of further substituents is not limited as long as the objects of the present invention are not inhibited, and is preferably 1 or more and 4 or less. In a case where the phenyl group, the naphthyl group and the heterocyclyl group have a plurality of substituents, the substituents may be the same as or different from each other.

When $R^{c12}$ is an optionally substituted carbazolyl group, the type of the substituent possessed by the carbazolyl group is not particularly limited as long as the objects of the present invention are not inhibited. Suitable examples of the substituent that the carbazolyl group may have are the same as the examples of a substituent of the substituent when $R^{c11}$ is the optionally substituted carbazolyl group.

In view of reactivity of the compound represented by formula (c1), $R^{c12}$ is preferably a group represented by the following formula (c2) or (c3).

[Chem. 9]

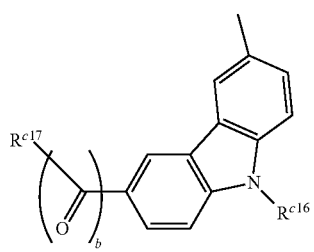

(c2)

[Chem. 10]

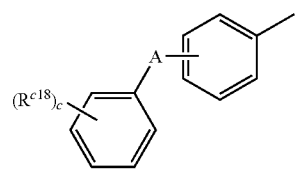

(c3)

In the formula (c2), $R^{c16}$ and $R^{c17}$ is respectively a monovalent organic group, and b is 0 or 1. In the formula (c3), $R^{c18}$ is a group selected from the group consisting of a monovalent organic group, an amino group, a halogen atom, a nitro group, and a cyano group, A is S or O, and c is an integer of 0 or more and 4 or less.

$R^{c16}$ in the formula (c2) can be selected from various kinds of organic groups as long as objects of the present invention are not inhibited. Suitable examples of $R^{c16}$ include a hydrogen atom, an alkyl group having 1 or more and 20 or less carbon atoms, a cycloalkyl group having 3 or more and 10 or less carbon atoms, a saturated aliphatic acyl group having 2 or more and 20 or less carbon atoms, an alkoxycarbonyl group having 2 or more and 20 or less carbon atoms, an optionally substituted phenyl group, an optionally substituted benzoyl group, an optionally substituted phenoxycarbonyl group, an optionally substituted phenylalkyl group having 7 or more and 20 or less carbon atoms, an optionally substituted naphthyl group, an optionally substituted naphthoyl group, an optionally substituted naphthoxycarbonyl group, an optionally substituted naphthylalkyl group having 11 or more and 20 or less carbon atoms, an optionally substituted heterocyclyl group, an optionally substituted heterocyclylcarbonyl group, and the like.

For $R^{c16}$, the alkyl group having 1 or more and 20 or less carbon atoms is preferable, the alkyl group having 1 or more and 6 or less carbon atoms is more preferable, and the ethyl group is particularly preferable.

$R^{c17}$ in the formula (c2) can be selected from various kinds of organic groups as long as objects of the present invention are not inhibited. Specific examples of the suitable group as $R^{c17}$ include a hydrogen atom, an alkyl group having 1 or more and 20 or less carbon atoms, an optionally substituted phenyl group, an optionally substituted naphthyl group, and an optionally substituted heterocyclyl group. For $R^{c17}$, among these groups, the optionally substituted phenyl group and the optionally substituted naphthyl group are more preferable, and a 2-methylphenyl group and a naphthyl group are particularly preferable.

When a phenyl group, a naphthyl group, and a heterocyclyl group included in $R^{c16}$ or $R^{c17}$ further has a substituent, examples of the substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group having an alkyl group which has 1 or more and 6 or less carbon atoms, a dialkylamino group having an alkyl group which has 1 or more and 6 or less carbon atoms, a morpholin-1-yl group, a piperazin-1-yl group, halogen, a nitro group, and a cyano group. When a phenyl group, a naphthyl group, and a heterocyclyl group included in $R^{c16}$ or $R^{c17}$ further have a substituent, the number of substituents is not particularly limited as long as the object of the present invention is not inhibited, and is preferably 1 or more and 4 or less. When a phenyl group, a naphthyl group, and a heterocyclyl group included in $R^{c16}$ or $R^{c17}$ have plural substituents, plural substituents may be the same as or different each other.

When $R^{c18}$ in the formula (c3) is the organic group, $R^{c18}$ can be selected from various kinds of organic groups as long as objects of the present invention are not inhibited. When $R^{c18}$ is the organic group in the formula (c3), suitable examples include an alkyl group having 1 or more and 6 or less carbon atoms; an alkoxy group having 1 or more and 6 or less carbon atoms; a saturated aliphatic acyl group having 2 or more and 7 or less carbon atoms; an alkoxycarbonyl group having 2 or more and 7 or less carbon atoms; a saturated aliphatic acyloxy group having 2 or more and 7 or less carbon atoms; a phenyl group; a naphthyl group; a benzoyl group; a naphthoyl group; a benzoyl group substituted with a group selected from the group consisting of an alkyl group having 1 or more and 6 or less carbon atoms, morpholin-1-yl group, piperazin-1-yl group, and a phenyl group; a monoalkylamino group having an alkyl group having 1 or more and 6 or less carbon atoms; a dialkylamino group having alkyl groups having 1 or more and 6 or less carbon atoms; a morpholin-1-yl group; a piperazin-1-yl group; a halogen atom; a nitro group; a cyano group; a 2-methylphenylcarbonyl group; a 4-(piperazine-1-yl)phenylcarbonyl group; 4-(phenyl)phenylcarbonyl group.

Among $R^{c18}$, a benzoyl group; a naphthoyl group; a benzoyl groups substituted with a group selected from the group consisting of an alkyl group having 1 or more and 6 or less carbon atoms, a morpholine-1-yl group, a piperazine-1-yl group, and a phenyl group; and a nitro group are preferred, and a benzoyl group; a naphthoyl group; a 2-methylphenyl carbonyl group; a 4-(piperazine-1-yl) phenyl carbonyl group; and a 4-(phenyl) phenyl carbonyl group are more preferred.

In formula (c3), c is preferably an integer of 0 or more and 3 or less, more preferably an integer of 0 or more and 2 or less, and particularly preferably 0 or 1. When c is 1, the position at which $R^{c18}$ bonds is preferably the para-position to the bonding through which the phenyl group (to which $R^{c18}$ bonds) bonds to an oxygen atom or a sulfur atom.

$R^{c13}$ is a hydrogen atom, an alkyl group having 1 or more and 6 or less carbon atoms, or an optionally substituted phenyl group. When $R^{c13}$ is the optionally substituted phenyl group, a substituent that the phenyl group may have is the same as that in the case where $R^{c11}$ is the optionally substituted phenyl group. $R^{c13}$ is preferably a methyl group, an ethyl group, or a phenyl group, and more preferably a methyl group or a phenyl group.

As a suitable compound among the compounds represented by the formula (c1), a compound represented by the formula (c4) is exemplified.

[Chem. 11]

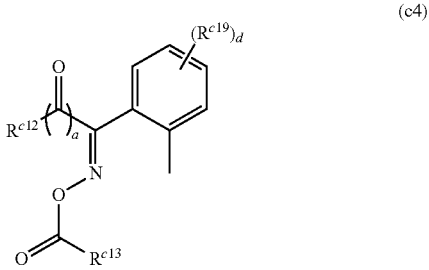

(c4)

a, $R^{c12}$, and $R^{c13}$ in the formula (c4) are the same as described previously. $R^{c19}$ is a group selected from the group consisting of a monovalent organic group, an amino group, a halogen atom, a nitro group, and a cyano group, and d is an integer of 0 or more and 4 or less.

In the above formula (c4), $R^{c19}$ is not particularly limited as long as objects of the present invention are not inhibited, and is appropriately selected from various organic groups, when $R^{c19}$ is the organic group. Suitable examples of the $R^{c19}$ include an alkyl group, an alkoxy group, a cycloalkyl group, a cycloalkoxy group, a saturated aliphatic acyl group, a saturated aliphatic acyloxy group, an alkoxycarbonyl group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with one or two organic groups, a morpholin-1-yl group, a piperazin-1-yl group, a halogen atom, a nitro group, a cyano group, and the like. When s is an integer of 2 or more and 4 or less, the plurality of $R^{c19}$ may be the same or different. The number of carbon atoms of the substituent does not include the number of carbon atoms of the further substituent that the substituent has.

When $R^{c19}$ is the alkyl group, the number of carbon atoms is preferably 1 or more and 20 or less, and more preferably 1 or more and 6 or less. In addition, when $R^{c19}$ is the alkyl group, the alkyl group may be linear or branched. When $R^{c19}$ is the alkyl group, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. In addition, when $R^{c19}$ is the alkyl group, the alkyl group may include ether bond(s) in the carbon chain. Examples of the alkyl group including ether bond(s) in the carbon chain include a methoxyethyl group, an ethoxyethyl group, a methoxyethoxyethyl group, an ethoxyethoxyethyl group, a propyloxyethoxyethyl group, a methoxypropyl group, and the like.

When $R^{c19}$ is the alkoxy group, the number of carbon atoms is preferably 1 or more and 20 or less, and more preferably 1 or more and 6 or less. In addition, when $R^{c19}$ is the alkoxy group, the alkoxy group may be linear or branched. When $R^{c19}$ is the alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group, and the like. When $R^{c19}$ is the alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group, and the like.

When $R^{c19}$ is a cycloalkyl group or a cycloalkoxy group, the number of carbon atoms of the cycloalkyl group or cycloalkoxy group is preferably 3 or more and 10 or less, and more preferably 3 or more and 6 or less. When $R^{c19}$ is the cycloalkyl group, specific examples include a cyclopropyl group, a cyclobutyl group, a cyclopentyl group, a cyclohexyl group, a cycloheptyl group, a cyclooctyl group, and the like. When $R^{c19}$ is the cycloalkoxy group, specific examples include a cyclopropyloxy group, a cyclobutyloxy group, a cyclopentyloxy group, a cyclohexyloxy group, a cycloheptyloxy group, a cyclooctyloxy group, and the like.

When $R^{c19}$ is the saturated aliphatic acyl group or the saturated aliphatic acyloxy group, the number of carbo atoms is preferably 2 or more and 20 or less, and more preferably 2 or more and 7 or less. When $R^{c19}$ is the saturated aliphatic acyl group, specific examples include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group, and the like. When $R^{c19}$ is the saturated aliphatic acyloxy group, specific examples include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group, and the like.

When $R^{c19}$ is the alkoxycarbonyl group, the number of carbon atoms is preferably 2 or more and 20 or less, and more preferably 2 or more and 7 or less. When $R^{c19}$ is the alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group, and the like.

When $R^{c19}$ is the phenylalkyl group, the number of carbon atoms is preferably 7 or more and 20 or less, and more preferably 7 or more and 10 or less. When $R^{c19}$ is the naphthylalkyl group, the number of carbon atoms is preferably 11 or more and 20 or less, and more preferably 11 or more and 14 or less. When $R^{c19}$ is the phenyl alkyl group, specific examples include a benzyl group, a 2-phenylethyl group, 3-phenylpropyl group and 4-phenylbutyl group. When $R^{c19}$ is the naphthylalkyl group, specific examples include an α-naphthylmethyl group, a β-naphthylmethyl group, a 2-(α-naphthyl)ethyl group, and a 2-(β-naphthyl) ethyl group. When $R^{c19}$ is the phenylalkyl group or the naphthylalkyl group, $R^{c19}$ may further have substituent(s) on the phenyl group or the naphthyl group.

When $R^{c19}$ is a heterocyclyl group, the heterocyclyl group is a 5-membered or 6-membered monocycle containing one or more N, S, and O, or a heterocyclyl group in which these monocycles are fused, or the monocycle and a benzene ring are fused. When the heterocyclyl group is a fused ring, the number of rings constituting the fused ring is 3 or less. Examples of the heterocycle constituting the heterocyclic group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, and the like. When $R^{c19}$ is a heterocyclyl group, the heterocyclyl group may have a substituent.

When $R^{c19}$ is an amino group substituted with one or two organic groups, suitable examples of the organic group include an alkyl group having 1 or more and 20 or less carbon atoms, a cycloalkyl group having 3 or more and 10 or less carbon atoms, a saturated aliphatic acyl group having 2 or more and 20 or less carbon atoms, a phenyl group which may have a substituent, a benzoyl group which may have a substituent, a phenylalkyl group having 7 or more and 20 or less carbon atoms which may have a substituent, a naphthyl group which may have a substituent, a naphthoyl group which may have a substituent, a naphthylalkyl group having 11 or more and 20 or less carbon atoms which may have a substituent, a heterocyclyl group, and the like. Specific examples of suitable organic group are the same as those in $R^{c19}$. Specific examples of the amino group substituted with one 1 or 2 organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoyl amino group, an n-hexanoylamino group, an n-heptanoylamino group, an n-octanoylamino group, an n-decanoylamino group, a benzoylamino group, an α-naphthoyl group, a β-naphthoyl group, and the like.

When an phenyl group, an naphthyl group, and a heterocyclyl group included in $R^{c19}$ further have a substituent, examples of the substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group which has an alkyl group having 1 or more and 6 or less carbon atoms, a dialkylamino group which has two alkyl groups having 1 or more and 6 or less carbon atoms, a morpholin-1-yl group, an piperazin-1-yl group, halogen, a nitro group, a cyano group, and the like. When a phenyl group, a naphthyl group, and a heterocyclyl group included in $R^{c19}$ further have a substituent, the number of substituents is not particularly limited as long as the object of the present invention is not inhibited, and is preferably 1 or more and 4 or less. When a phenyl group, a naphthyl group, and a heterocyclyl group included in $R^{c19}$ have plural substituents, plural substituents may be the same as or different each other.

Among $R^{c19}$, a group selected from the group consisting of an alkyl group having 1 or more and 6 or less carbon atoms, an alkoxy group having 1 or more and 6 or less carbon atoms, and a saturated aliphatic acyl group having 2 or more and 7 or less carbon atoms is preferred, an alkyl group having 1 or more and 6 or less carbon atoms is more preferred, and a methyl group is particularly preferable from the viewpoint of chemical stability and easiness of synthesis of an oxime ester compound with less steric hindrance.

When the position of a bond of a phenyl group and a main skeleton of an oxime ester compound is regarded as the 1-position and the position of a methyl group is regarded as the 2-position with respect to the phenyl group to which $R^{c19}$ is bonded, the position at which $R^{c19}$ is bonded to a phenyl group is preferably the 4-position or the 5-position, more preferably the 5-position. d is preferably an integer of 0 or more and 3 or less, more preferably an integer of 0 or more and 2 or less, and particularly preferably 0 or 1.

$R^{c13}$ in the formula (c4) is a hydrogen atom, an alkyl group having 1 or more and 6 or less carbon atoms, or an optionally substituted phenyl group. Specific examples of $R^{c13}$ are the same as described previously for the formula (c1). As $R^{c13}$ in the formula (c4), a methyl group, an ethyl group, and a phenyl group are preferable, and a methyl group, and phenyl group are more preferable.

Among the oxime ester compounds, suitable examples of a compound included in the formula (c1) but not in the formula (c4) include the following compounds.

[Chem. 12]

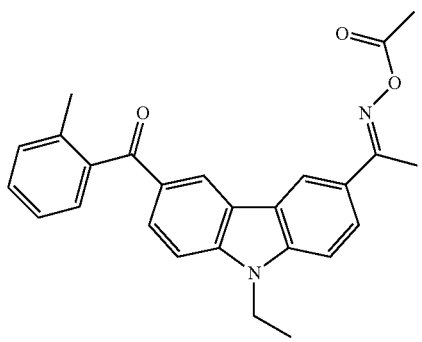

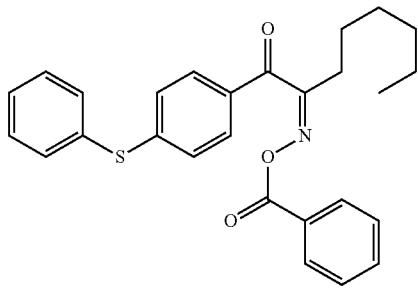

[Chem. 13]

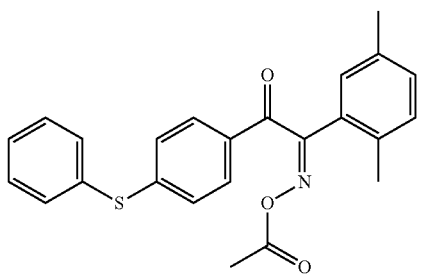
PI-1

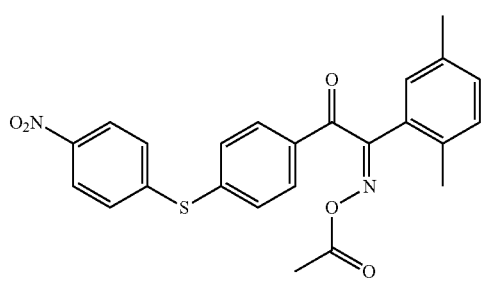
PI-2

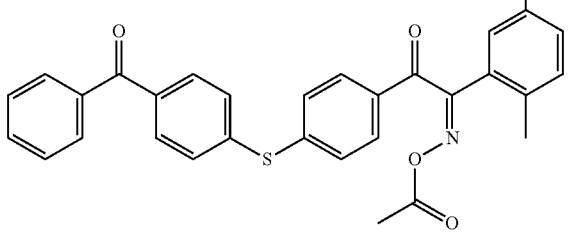
PI-3

PI-4

PI-5

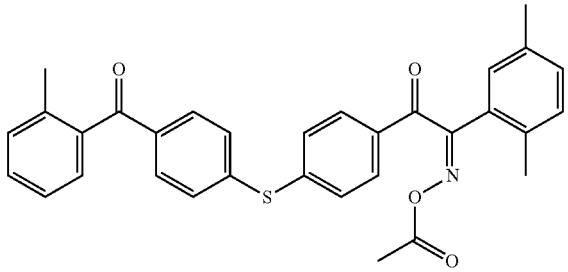

Among the oxime ester compounds represented by the formula (c4) that is particularly suitable as the oxime ester compound, examples of the particularly suitable compound include the following compounds.

-continued
PI-6
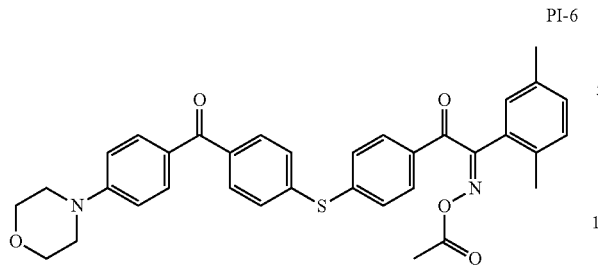
PI-12
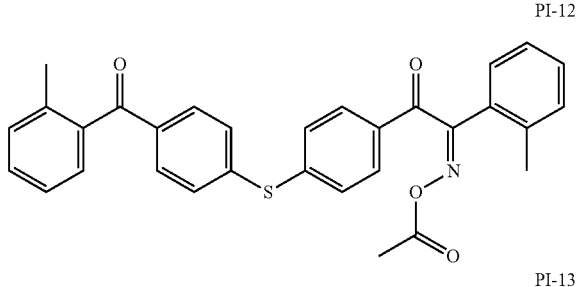
PI-7
PI-13
[Chem. 14]
PI-14
PI-8
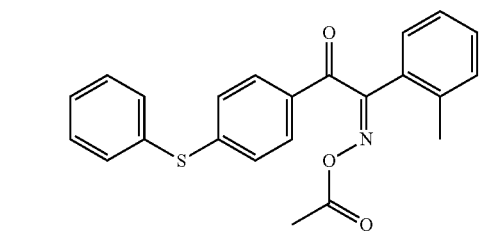
[Chem. 15]
PI-15
PI-9
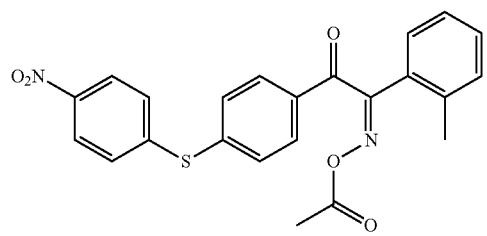
PI-16
PI-10
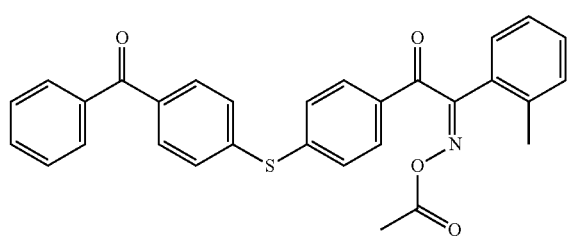
PI-17
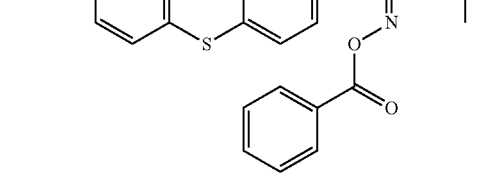
PI-11
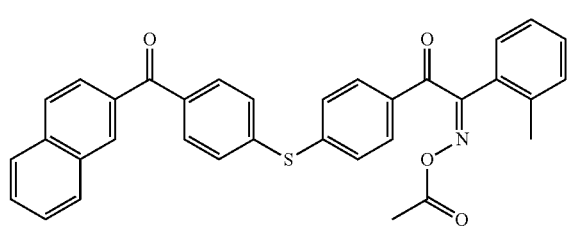
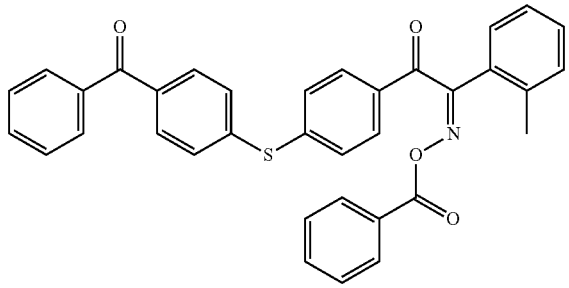

PI-18
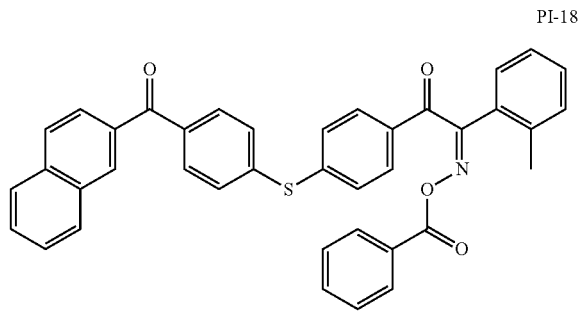
PI-19
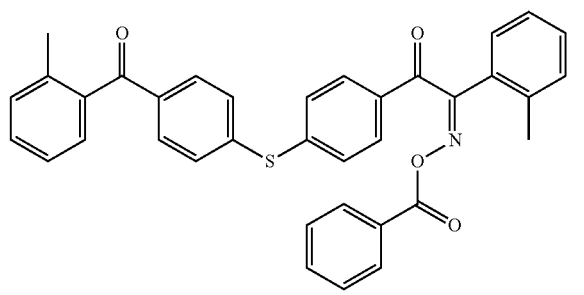
PI-20
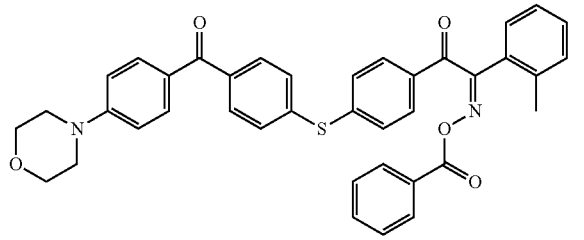
PI-21
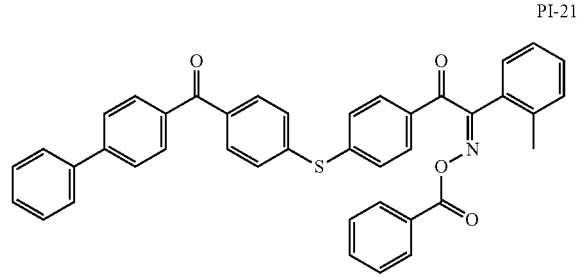
[Chem. 16]
PI-22
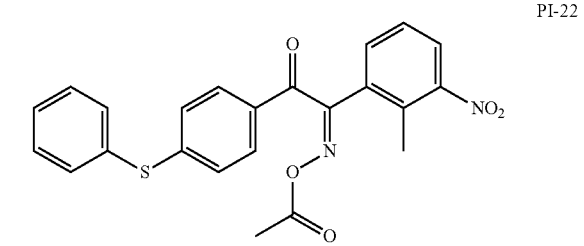
PI-23
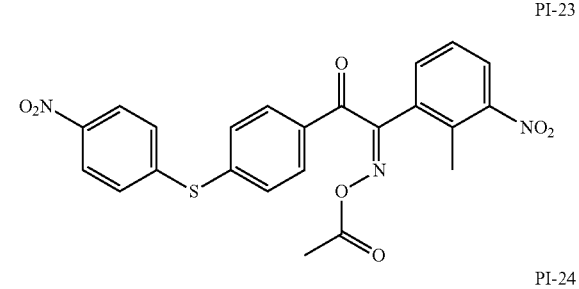
PI-24
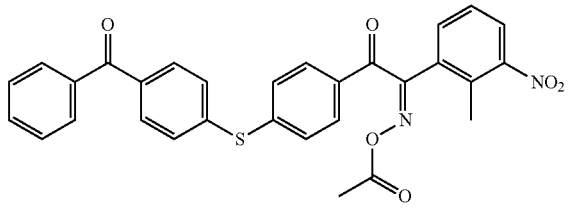
PI-25
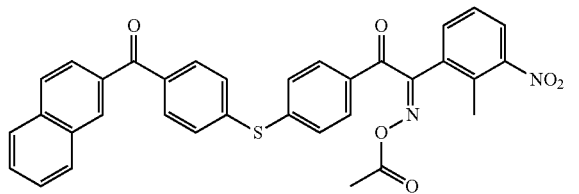
PI-26
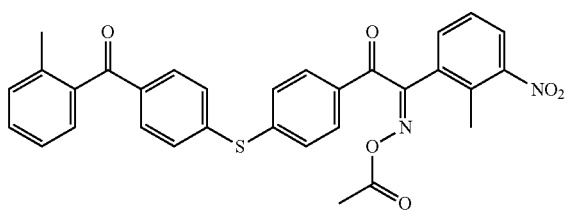
PI-27
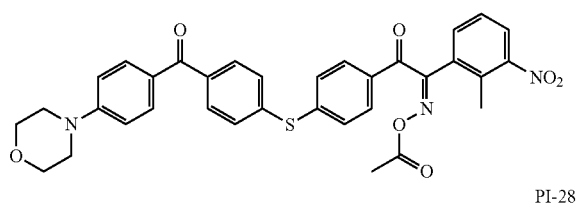
PI-28
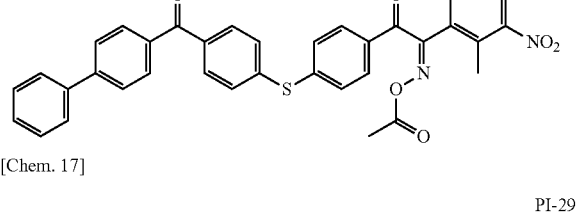
[Chem. 17]
PI-29
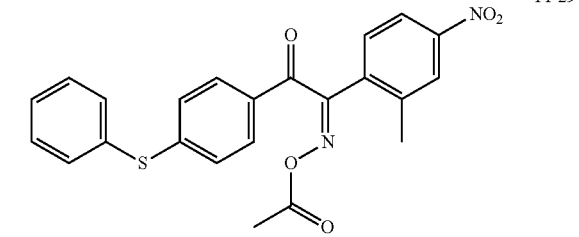

PI-30 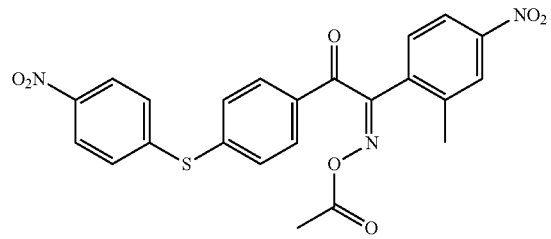
PI-36 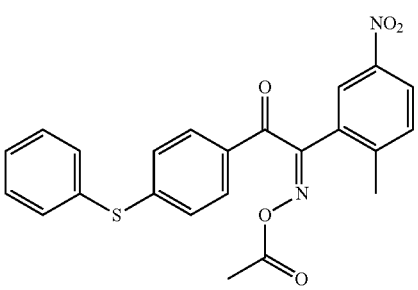
PI-31 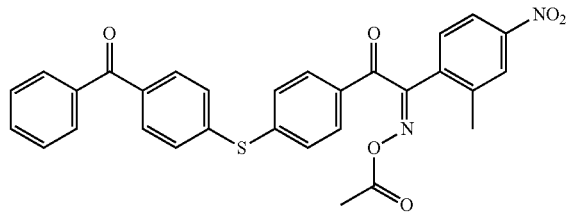
PI-37 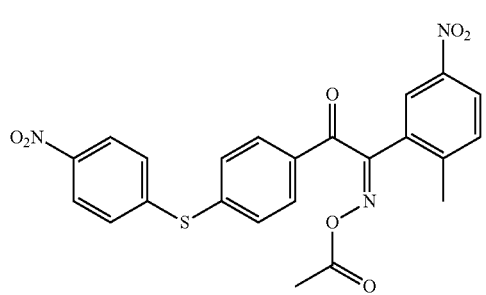
PI-32 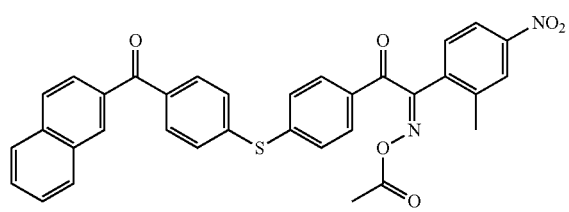
PI-38 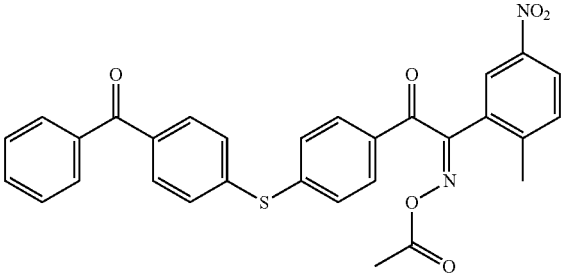
PI-33 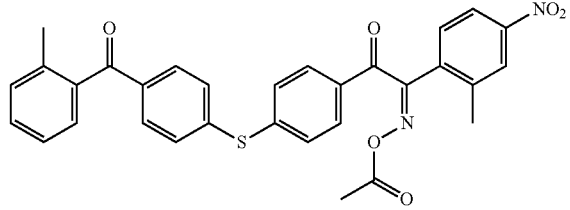
PI-39 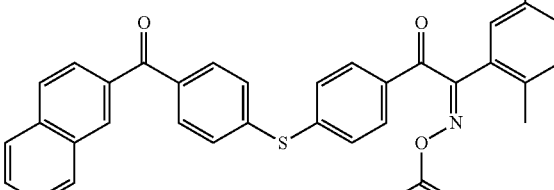
PI-34 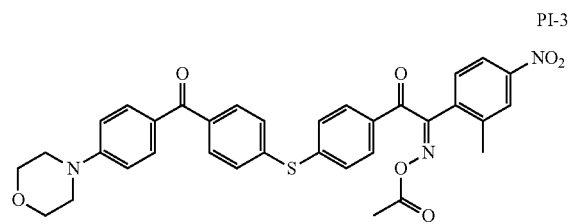
PI-40 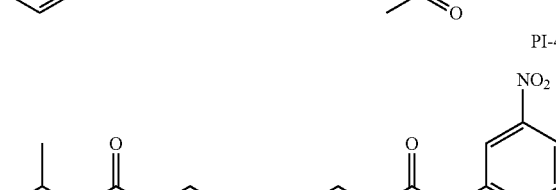
PI-35 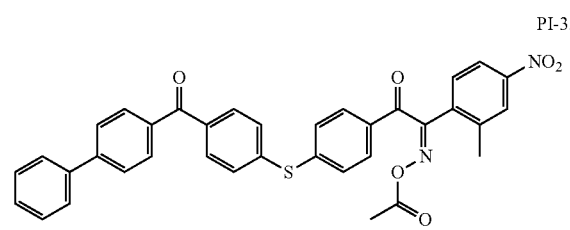
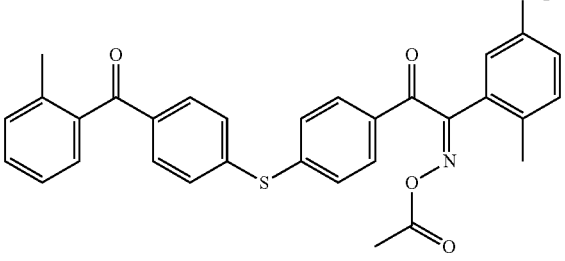

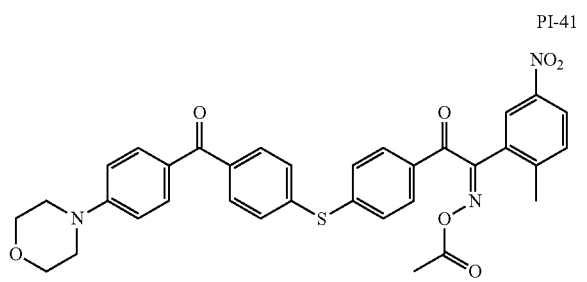

PI-41

PI-42

[Chem. 19]

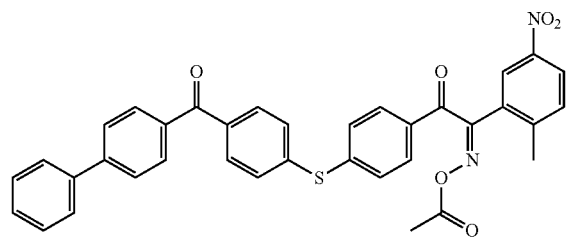

PI-43

PI-44

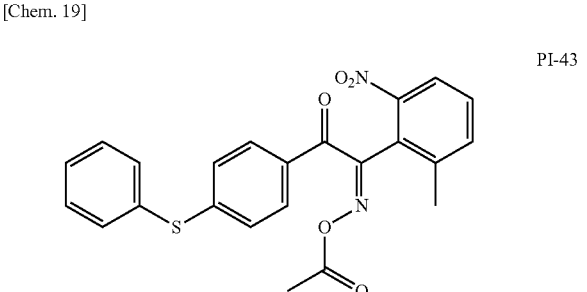

PI-45

PI-46

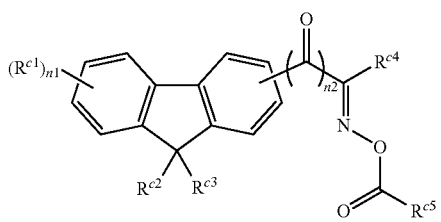

PI-47

PI-48

PI-49

In addition, in view of sensitivity of the photosensitive ink composition and transparency of the cured product, for the oxime ester compound, an oxime ester compound represented by the following formula (1) is particularly preferable as the oxime ester compound (C2).

[Chem. 20]

(1)

(In the formula (1), $R^{c1}$ is a hydrogen atom, a nitro group, or a monovalent organic group, $R^{c2}$ and $R^{c3}$ each represent an optionally substituted chain alkyl group, an optionally substituted cyclic organic group, or a hydrogen atom, $R^{c2}$ and $R^{c3}$ may be bonded to one another to form a ring, $R^{c4}$ is a monovalent organic group, $R^{c5}$ is a hydrogen atom, an optionally substituted alkyl group having 1 or more and 11 or less carbon atoms, or an optionally substituted aryl group, n1 is an integer of 0 or more and 4 or less, and n2 is 0 or 1.)

In the formula (1), $R^{c1}$ is the hydrogen atom, the nitro group, or the monovalent organic group. $R^{c1}$ bonds to a 6-membered aromatic ring other than a 6-membered aromatic ring that bonds to a group represented by —(CO)$_{n2}$— on the fluorene ring in the formula (1). In the formula (1), a position on the fluorene ring to which $R^{c1}$ bonds is not particularly limited. When the compound represented by the formula (1) has 1 or more $R^{c1}$, one of 1 or more $R^{c1}$ preferably bonds to 2-position in the fluorene ring in view of ease of synthesis of the compound represented by the formula (1). When a plurality of $R^{c1}$ exist, the plurality of $R^{c1}$ may be the same or different.

When $R^{c1}$ is the organic group, $R^{c1}$ is not particularly limited as long as the object of the present invention is not inhibited, and is appropriately selected from various organic groups. When $R^{c1}$ is the organic group, suitable examples include an alkyl group, an alkoxy group, a cycloalkyl group, a cycloalkoxy group, a saturated aliphatic acyl group, a saturated aliphatic acyloxy group, an alkoxycarbonyl group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an optionally substituted heterocyclylcarbonyl group, an amino group substituted with one or two organic groups, a morpholin-1-yl group, a piperazin-1-yl group, and the like.

When $R^{c1}$ is the alkyl group, the number of carbon atoms of the alkyl group is preferably 1 or more and 20 or less, and more preferably 1 or more and 6 or less. In addition, when $R^{c1}$ is the alkyl group, the alkyl group may be linear or branched. When $R^{c1}$ is the alkyl group, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. In addition, when $R^{c1}$ is the alkyl group, the alkyl group may include ether bond(s) in the carbon chain. Examples of the alkyl group including ether bond(s) in the carbon chain include a methoxyethyl group, an ethoxyethyl group, a methoxyethoxyethyl group, an ethoxyethoxyethyl group, a propyloxyethoxyethyl group, a methoxypropyl group, and the like.

When $R^{c1}$ is the alkoxy group, the number of carbon atoms of the alkoxy group is preferably 1 or more and 20 or less, and more preferably 1 or more and 6 or less. In addition, when $R^{c1}$ is the alkoxy group, the alkoxy group may be linear or branched. When $R^{c1}$ is an alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group, and the like. When $R^{c1}$ is an alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group, and the like.

When $R^{c1}$ is a cycloalkyl group or a cycloalkoxy group, the number of carbon atoms of the cycloalkyl group or cycloalkoxy group is preferably 3 or more and 10 or less, and more preferably 3 or more and 6 or less. When $R^{c1}$ is a cycloalkyl group, specific examples include a cyclopropyl group, a cyclobutyl group, a cyclopentyl group, a cyclohexyl group, a cycloheptyl group, a cyclooctyl group, and the like. When $R^{c1}$ is the cycloalkoxy group, specific examples include a cyclopropyloxy group, a cyclobutyloxy group, a cyclopentyloxy group, a cyclohexyloxy group, a cycloheptyloxy group, a cyclooctyloxy group, and the like.

When $R^{c1}$ is the saturated aliphatic acyl group or the saturated aliphatic acyloxy group, the number of carbon atoms of the saturated aliphatic acyl group or the saturated aliphatic acyloxy group is preferably 2 or more and 21 or less, and more preferably 2 or more and 7 or less. When $R^{c1}$ is the saturated aliphatic acyl group, specific examples include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group, and the like. When $R^{c1}$ is the saturated aliphatic acyloxy group, specific examples include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group, and the like.

When $R^{c1}$ is the alkoxycarbonyl group, the number of carbon atoms of the alkoxycarbonyl group is preferably 2 or more and 20 or less, and more preferably 2 or more and 7 or less. When $R^{c1}$ is an alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group, and the like.

When $R^{c1}$ is the phenylalkyl group, the number of carbon atoms of the phenylalkyl group is preferably 7 or more and 20 or less, and more preferably 7 or more and 10 or less. When $R^{c1}$ is the naphthylalkyl group, the number of carbon atoms of the naphthylalkyl group is preferably 11 or more and 20 or less, and more preferably 11 or more and 14 or less. When $R^{c1}$ is the phenyl alkyl group, specific examples include a benzyl group, a 2-phenylethyl group, 3-phenylpropyl group and 4-phenylbutyl group. When $R^{c1}$ in the naphthylalkyl group, specific examples include an α-naphthylmethyl group, a β-naphthylmethyl group, a 2-(α-naphthyl)ethyl group, and a 2-(β-naphthyl)ethyl group. When $R^{c1}$ in the phenylalkyl group or the naphthylalkyl group, Rc1 may further have substituent(s) on the phenyl group or the naphthyl group.

When $R^{c1}$ is a heterocyclyl group, the heterocyclyl group is a 5-membered or 6-membered monocycle containing one or more N, S, and O, or a heterocyclyl group in which these monocycles are fused, or the monocycle and a benzene ring are fused. When the heterocyclyl group is a fused ring, the number of rings constituting the fused ring is 3 or less. The heterocyclyl group may be either an aromatic group (heteroaryl group) or a non-aromatic group. Examples of the heterocycle constituting the heterocyclic group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, piperidine, piperazine, morpholine, piperidine, tetrahydropyran, tetrahydrofuran, and the like. When $R^{c1}$ is a heterocyclyl group, the heterocyclyl group may have a substituent.

When $R^{c1}$ is the heterocyclylcarbonyl group, the heterocyclyl group included in the heterocyclylcarbonyl group is the same as that in the case where $R^{c1}$ is the heterocyclyl group.

When $R^{c1}$ is an amino group substituted with one or two organic groups, suitable examples of the organic group include an alkyl group having 1 or more and 20 or less carbon atoms, a cycloalkyl group having 3 or more and 10 or less carbon atoms, a saturated aliphatic acyl group having 2 or more and 21 or less carbon atoms, a phenyl group which may have a substituent, a benzoyl group which may have a substituent, a phenylalkyl group having 7 or more and 20 or less carbon atoms which may have a substituent, a naphthyl group which may have a substituent, a naphthoyl group which may have a substituent, a naphthylalkyl group having 11 or more and 20 or less carbon atoms which may have a substituent, a heterocyclyl group, and the like. Specific examples of suitable organic group are the same as those in $R^{c1}$. Specific examples of the amino group substituted with one 1 or 2 organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoyl amino group, an n-hexanoylamino group, an n-heptanoylamino group, an n-octanoylamino group, an n-decanoylamino group, a benzoylamino group, an α-naphthoyl group, a β-naphthoyl group, and the like.

When an phenyl group, an naphthyl group, and a heterocyclyl group included in $R^{c1}$ further have a substituent, examples of the substituent include an alkyl group having 1 or more and 6 or less carbon atoms, an alkoxy group having 1 or more and 6 or less carbon atoms, a saturated aliphatic acyl group having 2 or more and 7 or less carbon atoms, an alkoxycarbonyl group having 2 or more and 7 or less carbon atoms, a saturated aliphatic acyloxy group having 2 or more and 7 or less carbon atoms, a monoalkylamino group which has an alkyl group having 1 or more and 6 or less carbon atoms, a dialkylamino group which has two alkyl groups having 1 or more and 6 or less carbon atoms, a morpholin-1-yl group, an piperazin-1-yl group, halogen, a nitro group, a cyano group, and the like. When a phenyl group, a naphthyl group, and a heterocyclyl group included in $R^{c1}$ further have a substituent, the number of substituents is not particularly limited as long as the object of the present invention is not inhibited, and is preferably 1 or more and 4 or less. When a phenyl group, a naphthyl group, and a heterocyclyl group included in $R^{c1}$ have plural substituents, plural substituents may be the same as or different each other.

Among the above-described groups, $R^{c1}$ is preferably a nitro group or a group represented as $R^{c10}$—CO— since the sensitivity tends to be enhanced. $R^{c10}$ is not particularly limited as long as it does not interfere with the object of the present invention, and can be selected from various organic groups. Examples of the group suitable as $R^{c10}$ include an alkyl group having 1 or more and 20 or less carbon atoms, an optionally substituted phenyl group, an optionally substituted naphthyl group, and an optionally substituted heterocyclyl group. Among these groups, $R^{c10}$ is particularly preferably a 2-methylphenyl group, a thiophen-2-yl group, and an α-naphthyl group. Moreover, it is preferred that $R^{c1}$ is a hydrogen atom since the transparency tends to be satisfactory. Note here that when $R^{c1}$ is a hydrogen atom and $R^{c14}$ is a group represented by the formula (1a) or (1b) mentioned later, the transparency tends to be even more satisfactory.

In the formula (1), $R^{c2}$ and $R^{c3}$ each represent an optionally substituted chain alkyl group, an optionally substituted cyclic organic group, or a hydrogen atom. $R^{c2}$ and $R^{c3}$ may be bonded to one another to form a ring. Among these groups, preferably, $R^{c2}$ and $R^{c3}$ are optionally substituted chain alkyl groups. When $R^{c2}$ and $R^{c3}$ are optionally substituted chain alkyl groups, a chain alkyl group may be either a linear alkyl group or a branched alkyl group.

When $R^{c2}$ and $R^{c3}$ are chain alkyl groups having no substituent, the number of carbon atoms of the chain alkyl group is preferably 1 or more and 20 or less, more preferably 1 or more and 10 or less, and particularly preferably 1 or more and 6 or less. When $R^{c2}$ and $R^{c3}$ are chain alkyl groups, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group, and the like. When $R^{c2}$ and $R^{c3}$ are alkyl groups, the alkyl group may have an ether bond (—O—) in a carbon chain. Examples of the alkyl group having an ether bond in a carbon chain include a methoxyethyl group, an ethoxyethyl group, a methoxyethoxyethyl group, an ethoxyethoxyethyl group, a propyloxyethoxyethyl group, and a methoxypropyl group.

When $R^{c2}$ and $R^{c3}$ are chain alkyl groups having a substituent, the number of carbon atoms of the chain alkyl group is preferably 1 or more and 20 or less, more preferably 1 or more and 10 or less, and particularly preferably 1 or more and 6 or less. In this case, the number of carbon atoms of the substituent is not included in the number of carbon atoms of the chain alkyl group. The chain alkyl group having a substituent is preferably a linear group. The substituent, with which the alkyl group is optionally substituted, is not particularly limited as long as the object of the present invention is not inhibited. Suitable examples of the substituent include a cyano group, a halogen atom, a cyclic organic group, and an alkoxycarbonyl group. A fluorine atom, a chlorine atom, a bromine atom, and an iodine atom are exemplified as the halogen atom. Among these, the fluorine atom, the chlorine atom, and the bromine atom are preferred. A cycloalkyl group, an aromatic hydrocarbon group, and a heterocyclyl group are exemplified as the cyclic organic group. Specific examples of the cycloalkyl group are the same as the suitable examples of the cycloalkyl group as $R^{c1}$. Specific examples of the aromatic hydrocarbon group include a phenyl group, a naphthyl group, a biphenylyl group, an anthryl group, a phenanthryl group, and the like. The specific examples of the heterocyclyl group are the same as the suitable examples of the heterocyclyl group as $R^{c1}$. When $R^{c1}$ is the alkoxycarbonyl group, an alkoxy group included in the alkoxycarbonyl group may be linear or branched, and is preferably linear. The number of carbon atoms of the alkoxy group included in the alkoxycarbonyl group is preferably 1 or more and 10 or less, and more preferably 1 or more and 6 or less.

When the chain alkyl group has one or more substituents, the number of substituents is not particularly limited. The preferred number of substituents depends on the number of carbon atoms in the chain alkyl group. The number of substituents is typically 1 or more and 20 or less, preferably 1 or more and 10 or less, and more preferably 1 or more and 6 or less.

When $R^{c2}$ and $R^{c3}$ are cyclic organic groups, the cyclic organic group may be either an alicyclic group or an aromatic group. Examples of the cyclic organic group include an aliphatic cyclic hydrocarbon group, an aromatic hydrocarbon group, and a heterocyclyl group. When $R^{c2}$ and $R^{c3}$ are cyclic organic groups, the substituent, which the cyclic organic group may have, is the same as in a case where $R^{c2}$ and $R^{c3}$ are chain alkyl groups.

When $R^{c2}$ and $R^{c3}$ are aromatic hydrocarbon groups, the aromatic hydrocarbon group is preferably a phenyl group, or a group formed by bonding plural benzene rings through a carbon-carbon bond, or a group formed by fusion of plural benzene rings. When the aromatic hydrocarbon group is a phenyl group, or a group formed by bonding or fusing plural benzene rings, the number of rings of a benzene ring included in the aromatic hydrocarbon group is not particularly limited, and is preferably 3 or less, more preferably 2 or less, and particularly preferably 1. Preferred specific examples of the aromatic hydrocarbon group include a phenyl group, a naphthyl group, a biphenylyl group, an anthryl group, a phenanthryl group, and the like.

When $R^{c2}$ and $R^{c3}$ are aliphatic cyclic hydrocarbon groups, the aliphatic cyclic hydrocarbon group may be either a monocyclic or polycyclic group. The number of carbon atoms of the aliphatic cyclic hydrocarbon group is not particularly limited, and is preferably 3 or more 20 or less, and more preferably 3 or more and 10 or less. Examples of the monocyclic cyclic hydrocarbon group include cyclopropyl group, a cyclobutyl group, a cyclopentyl group, a cyclohexyl group, a cycloheptyl group, a cyclooctyl group, a norbornyl group, an isobornyl group, a tricyclononyl group, a tricyclodecyl group, a tetracyclododecyl group, an adamantyl group, and the like.

When $R^{c2}$ and $R^{c3}$ are heterocyclyl groups, the heterocyclyl group is a 5-membered or 6-membered monocycle containing one or more N, S, and O, or a heterocyclyl group in which these monocycles are fused, or the monocycle and a benzene ring are fused. When the heterocyclyl group is a fused ring, the number of rings constituting the fused ring is 3 or less. The heterocyclyl group may be either an aromatic group (heteroaryl group) or a non-aromatic group. Examples of the heterocycle constituting the heterocyclic group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, piperidine, piperazine, morpholine, piperidine, tetrahydropyran, tetrahydrofuran, and the like.

$R^{c2}$ and $R^{c3}$ may be bonded to one another to form a ring. The group composed of the ring formed by $R^{c2}$ and $R^{c3}$ is preferably a cycloalkylidene group. When $R^{c2}$ and $R^{c3}$ are bonded to form a cycloalkylidene group, the ring constituting the cycloalkylidene group is preferably a 5-membered ring or a 6-membered ring, and more preferably a 5-membered ring.

When the group formed by bonding $R^{c2}$ and $R^{c3}$ is a cycloalkylidene group, the cycloalkylidene group may be fused with one or more other rings. Examples of the ring which may be fused with the cycloalkylidene group include a benzene ring, a naphthalene ring, a cyclobutane ring, a cyclopentane ring, a cyclohexane ring, a cycloheptane ring, a cyclooctane ring, a furan ring, a thiophene ring, a pyrrole ring, a pyridine ring, a pyrazine ring, a pyrimidine ring, and the like.

Examples of suitable group among $R^{c2}$ and $R^{c3}$ descried above include a group represented by the formula: -$A^1$-$A^2$. In the formula, $A^1$ is a linear chain alkylene group, and $A^2$ is an alkoxy group, a cyano group, a halogen atom, a halogenated alkyl group, a cyclic organic group, or an alkoxycarbonyl group.

The number of carbon atoms of the linear alkylene group for $A^1$ is preferably 1 or more and 10 or less, and more preferably 1 or more and 6 or less. When $A^2$ is an alkoxy group, the alkoxy group may be a linear or branched alkoxy group, and preferably a linear alkoxy group. The number of carbon atoms of the alkoxy group is preferably 1 or more and 10 or less, and more preferably 1 or more and 6 or less. When $A^2$ is a halogen atom, a fluorine atom, a chlorine atom, a bromine atom, or an iodine atom is preferable, and a fluorine atom, a chlorine atom, or a bromine atom is more preferable. When $A^2$ is a halogenated alkyl group, a halogen atom included in the halogenated alkyl group is preferably a fluorine atom, a chlorine atom, a bromine atom, or an iodine atom, and more preferably is a fluorine atom, a chlorine atom, or a bromine atom. The halogenated alkyl group may be a linear or branched halogenated alkyl group, preferably a linear halogenated alkyl group. When $A^2$ is a cyclic organic group, examples of the cyclic organic group are the same as the cyclic organic group possessed by $R^{c2}$ and $R^{c3}$ as a substituent. When $A^2$ is an alkoxycarbonyl group, examples of the alkoxycarbonyl group are the same as the alkoxycarbonyl group possessed by $R^{c2}$ and $R^{c3}$ as a substituent.

Suitable specific examples of $R^{c2}$ and $R^{c3}$ include alkyl groups such as an ethyl group, an n-propyl group, an n-butyl group, an n-hexyl group, an n-heptyl group, and an n-octyl group; alkoxyalkyl groups such as a 2-methoxyethyl group, a 3-methoxy-n-propyl group, a 4-methoxy-n-butyl group, a 5-methoxy-n-pentyl group, a 6-methoxy-n-hexyl group, a 7-methoxy-n-heptyl group, a 8-methoxy-n-octyl group, a 2-ethoxyethyl group, a 3-ethoxy-n-propyl group, a 4-ethoxy-n-butyl group, a 5-ethoxy-n-pentyl group, a 6-ethoxy-n-hexyl group, a 7-ethoxy-n-heptyl group, and a 8-ethoxy-n-octyl group; cyanoalkyl groups such as a 2-cyanoethyl group, a 3-cyano-n-propyl group, a 4-cyano-n-butyl group, a 5-cyano-n-pentyl group, a 6-cyano-n-hexyl group, a 7-cyano-n-heptyl group, and a 8-cyano-n-octyl group; phenylalkyl groups such as a 2-phenylethyl group, a 3-phenyl-n-propyl group, a 4-phenyl-n-butyl group, a 5-phenyl-n-pentyl group, a 6-phenyl-n-hexyl group, a 7-phenyl-n-heptyl group, and a 8-phenyl-n-octyl group; cycloalkylalkyl groups such as a 2-cyclohexylethyl group, a 3-cyclohexyl-n-propyl group, a 4-cyclohexyl-n-butyl group, a 5-cyclohexyl-n-pentyl group, a 6-cyclohexyl-n-hexyl group, a 7-cyclohexyl-n-heptyl group, a 8-cyclohexyl-n-octyl group, a 2-cyclopentylethyl group, a 3-cyclopentyl-n-propyl group, a 4-cyclopentyl-n-butyl group, a 5-cyclopentyl-n-pentyl group, a 6-cyclopentyl-n-hexyl group, a 7-cyclopentyl-n-heptyl group, and a 8-cyclopentyl-n-octyl group; alkoxycarbonylalkyl groups such as a 2-methoxycarbonylethyl group, a 3-methoxycarbonyl-n-propyl group, a 4-methoxycarbonyl-n-butyl group, a 5-methoxycarbonyl-n-pentyl group, a 6-methoxycarbonyl-n-hexyl group, a 7-methoxycarbonyl-n-heptyl group, a 8-methoxycarbonyl-n-octyl group, a 2-ethoxycarbonylethyl group, a 3-ethoxycarbonyl-n-propyl group, a 4-ethoxycarbonyl-n-butyl group, a 5-ethoxycarbonyl-n-pentyl group, a 6-ethoxycarbonyl-n-hexyl group, a 7-ethoxycarbonyl-n-heptyl group, and a 8-ethoxycarbonyl-n-octyl group; and halogenated alkyl groups such as a 2-chloroethyl group, a 3-chloro-n-propyl group, a 4-chloro-n-butyl group, a 5-chloro-n-pentyl group, a 6-chloro-n-hexyl group, a 7-chloro-n-heptyl group, a 8-chloro-n-octyl group, a 2-bromoethyl group, a 3-bromo-n-propyl group, a 4-bromo-n-butyl group, a 5-bromo-n-pentyl group, a 6-bromo-n-hexyl group, a 7-bromo-n-heptyl group, a 8-bromo-n-octyl group, a 3,3,3-trifluoropropyl group, and a 3,3,4,4,5,5,5-heptafluoro-n-pentyl group.

Among groups mentioned above, groups suitable as $R^{c2}$ and $R^{c3}$ are an ethyl group, an n-propyl group, an n-butyl group, an n-pentyl group, a 2-methoxyethyl group, a 2-cyanoethyl group, a 2-phenylethyl group, a 2-cyclohexylethyl group, a 2-methoxycarbonylethyl group, a 2-chloroethyl group, a 2-bromoethyl group, a 3,3,3-trifluoropropyl group, and a 3,3,4,4,5,5,5-heptafluoro-n-pentyl group.

In the same manner as $R^{c1}$, examples of a suitable organic group for $R^{c4}$ include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an optionally substituted heterocyclylcarbonyl group, an amino group substituted with one or two organic groups, a morpholin-1-yl group, a piperazin-1-yl group, and the like. Specific examples of these groups are the same as the specific examples described for $R^{c1}$. $R^{c4}$ is also preferably a cycloalkylalkyl group, a phenoxyalkyl group which may have a substituent on the aromatic ring, and a phenylthioalkyl group which may have a substituent on the aromatic ring. The substituent which may be possessed by a phenoxyalkyl group and phenylthioalkyl group is the same as the substituent which may be possessed by a phenyl group included in $R^{c1}$.

Among the organic groups, $R^{c4}$ is preferably an alkyl group, a cycloalkyl group, an optionally substituted phenyl group or cycloalkylalkyl group, or a phenylthioalkyl group which may have a substituent on the aromatic ring. The alkyl group is preferably an alkyl group having 1 or more and 20 or less carbon atoms, more preferably an alkyl group having 1 or more and 8 or less carbon atoms, particularly preferably an alkyl group having 1 or more and 4 or less carbon atoms, and most preferably a methyl group. Among optionally substituted phenyl groups, a methylphenyl group is preferable, and a 2-methylphenyl group is more preferable. The number of carbon atoms of the cycloalkyl group included in the cycloalkylalkyl group is preferably 5 or more and 10 or less, more preferably 5 or more and 8 or less, and particularly preferably 5 or 6. The number of carbon atoms of the alkylene group included in the cycloalkylalkyl group is preferably 1 or more and 8 or less, more preferably 1 or more and 4 or less, and particularly preferably 2. Among cycloalkylalkyl groups, a cyclopentylethyl group is preferable. The number of carbon atoms of the alkylene group included in the phenylthioalkyl group which may have a substituent on the aromatic ring is preferably 1 or more and 8 or less, more preferably 1 or more and 4 or less, and particularly preferably 2. Among the phenylthioalkyl groups which may have a substituent on the aromatic ring, a 2-(4-chlorophenylthio)ethyl group is preferable.

$R^{c14}$ is also preferably a group represented by -$A^3$-CO—O-$A^4$. $A^3$ is a divalent organic group, preferably a divalent hydrocarbon group, and more preferably an alkylene group. $A^4$ is a monovalent organic group, and preferably a monovalent hydrocarbon group.

When $A^3$ is an alkylene group, the alkylene group may be a linear or branched alkylene group, preferably a linear alkylene group. When $A^3$ is an alkylene group, the number of carbon atoms of the alkylene group is preferably 1 or more and 10 or less, more preferably 1 or more and 6 or less, and particularly preferably 1 or more and 4 or less.

Suitable examples of $A^4$ include an alkyl group having 1 or more and 10 or less carbon atoms, an aralkyl group having 7 or more and 20 or less carbon atoms, and an aromatic hydrocarbon group having 6 or more and 20 or less carbon atoms. Suitable specific examples of $A^4$ include a methyl group, an ethyl group, an n-propyl group, an isopropyl group, an n-butyl group, an isobutyl group, a sec-butyl group, a tert-butyl group, an n-pentyl group, an n-hexyl group, a phenyl group, a naphthyl group, a benzyl group, a phenethyl group, an α-naphthylmethyl group, a β-naphthylmethyl group, and the like.

Specific examples of a suitable group represented by -$A^3$-CO—O-$A^4$ include a 2-methoxycarbonylethyl group, a 2-ethoxycarbonylethyl group, a 2-n-propyloxycarbonylethyl group, a 2-n-butyloxycarbonylethyl group, a 2-n-pentyloxycarbonylethyl group, a 2-n-hexyloxycarbonylethyl group, a 2-benzyloxycarbonylethyl group, a 2-phenoxycarbonylethyl group, a 3-methoxycarbonyl-n-propyl group, a 3-ethoxycarbonyl-n-propyl group, a 3-n-propyloxycarbonyl-n-propyl group, a 3-n-butyloxycarbonyl-n-propyl group, a 3-n-pentyloxycarbonyl-n-propyl group, a 3-n-hexyloxycarbonyl-n-propyl group, a 3-benzyloxycarbonyl-n-propyl group, a 3-phenoxycarbonyl-n-propyl group, and the like.

While $R^{c4}$ has been described above, $R^{c4}$ is preferably a group represented by the following formula (1a) or (1b).

[Chem. 21]

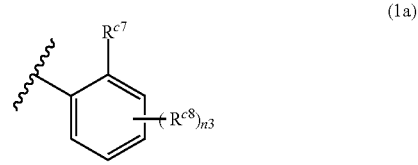

(1a)

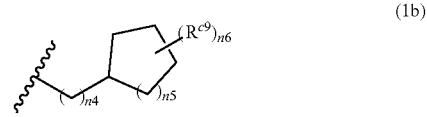

(1b)

(In the formulas (1a) and (1b), $R^{c7}$ and $R^{c8}$ each are an organic group, n3 is an integer of 0 or more and 4 or less; when $R^{c7}$ and $R^{c8}$ exist at adjacent positions on a benzene ring, $R^{c7}$ and $R^{c8}$ may be bonded to one another to form a ring; n4 is an integer of 1 or more and 8 or less; n5 is an integer of 1 or more and 5 or less; n6 is an integer of 0 or more and (n5+3); and $R^{c9}$ is an organic group.)

Examples of the organic group for $R^{c7}$ and $R^{c8}$ in the formula (1a) are the same as those in $R^{c1}$. $R^{c7}$ is preferably an alkyl group or a phenyl group. When $R^{c7}$ is the alkyl group, the number of carbon atoms thereof is preferably 1 or more and 10 or less, more preferably 1 or more and 5 or less, preferably 1 or more and 3 or less, and most preferably 1. Namely, $R^{c7}$ is most preferably a methyl group. When $R^{c7}$ and $R^{c8}$ are bonded to form a ring, the ring may be either one of an aromatic ring or an aliphatic ring. Suitable examples of the group represented by the formula (1a) in which $R^{c7}$ and $R^{c8}$ form a ring include a naphthalen-1-yl group, a 1,2,3,4-tetrahydronaphthalen-5-yl group, and the like. In the above formula (1a), n3 is an integer of 0 or more and 4 or less, preferably 0 or 1, and more preferably 0.

In the above formula (1b), $R^{c9}$ is an organic group. Examples of the organic group include the same group as the organic group described for $R^{c1}$. Among the organic groups, an alkyl group is preferable. The alkyl group may be any one of linear and branched alkyl groups. The number of carbon atoms of the alkyl group is preferably 1 or more and 10 or less, more preferably, 1 or more and 5 or less, and particularly preferably 1 or more and 3 or less. Preferable examples of $R^{c9}$ include a methyl group, an ethyl group, a propyl group, an isopropyl group, a butyl group, and the like. Among these, the methyl group is more preferable.

In the above formula (1b), n5 is an integer of 1 or more and 5 or less, preferably 1 or more and 3 or less, and more preferably 1 or 2. In the formula (1b), n6 is 0 or more and (n5+3) or less, preferably an integer of 0 or more and 3 or less, more preferably an integer of 0 or more and 2 or less, and particularly preferably 0. In the formula (1b), n4 is an integer of 1 or more and 8 or less, preferably an integer of 1 or more and 5 or less, more preferably an integer of 1 or more and 3 or less, and particularly preferably 1 or 2.

In the formula (1), $R^{c5}$ is a hydrogen atom, an alkyl group having 1 or more and 11 or less carbon atoms which may have a substituent, or an aryl group which may have a substituent. When $R^{c5}$ is an alkyl group, preferable examples of optional substituents include a phenyl group, a naphthyl group, and the like. When $R^{c1}$ is an aryl group, preferable examples of optional substituents include an alkyl group having 1 or more and 5 or less carbon atoms, an alkoxy group, a halogen atom, and the like.

In the formula (1), suitable examples of $R^{c5}$ include a hydrogen atom, a methyl group, an ethyl group, an n-propyl group, an isopropyl group, an n-butyl group, a phenyl group, a benzyl group, and a methyl phenyl group. Among these, the methyl group or the phenyl group is preferable.

Suitable examples of the compound represented by the formula (1) include the following PI-43 to PI-83.

[Chem. 22]

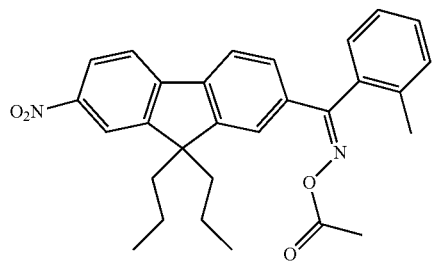

PI-43

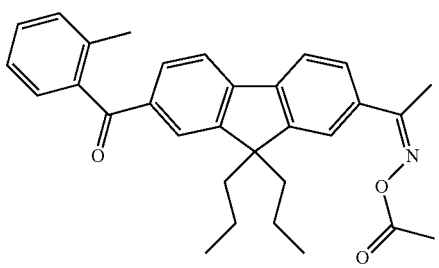

PI-44

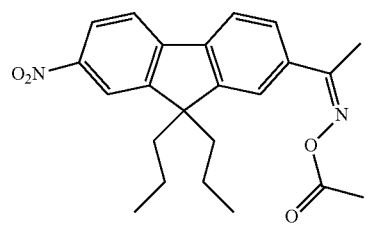

PI-45

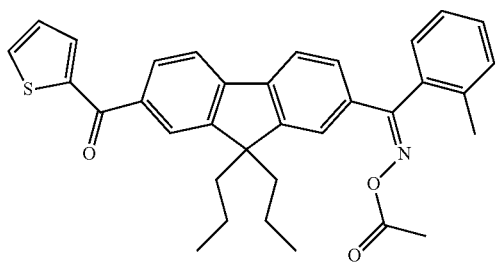

PI-46

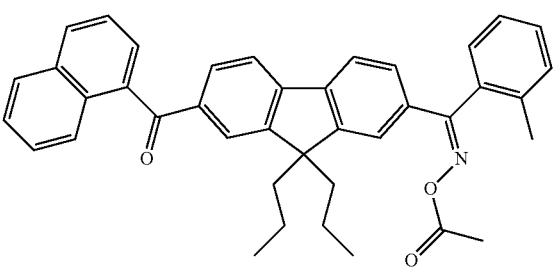

PI-47

PI-48 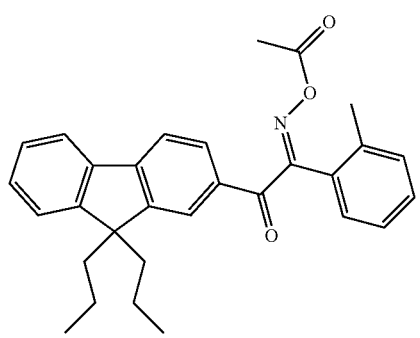
PI-52 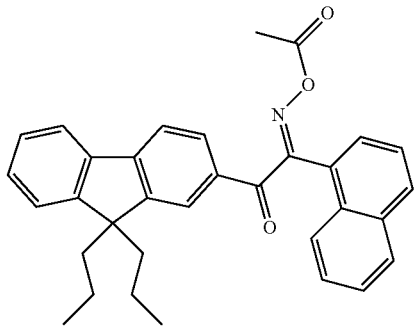
PI-49 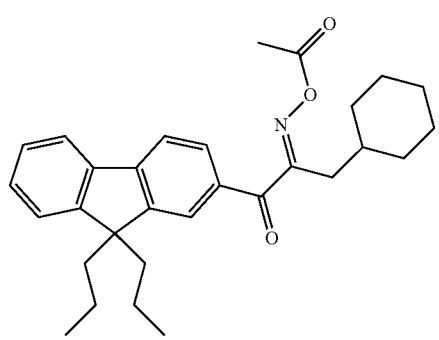
PI-53 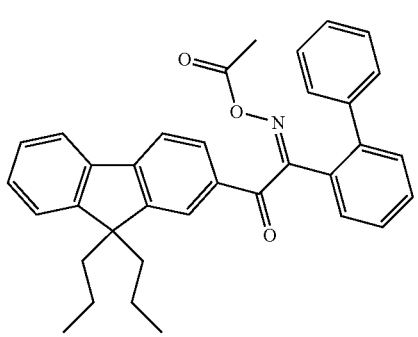
PI-50 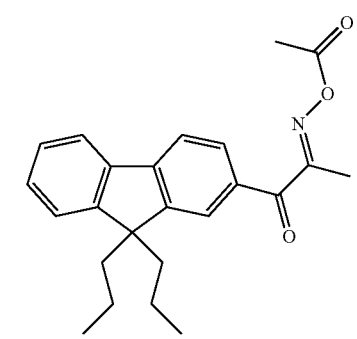
PI-54 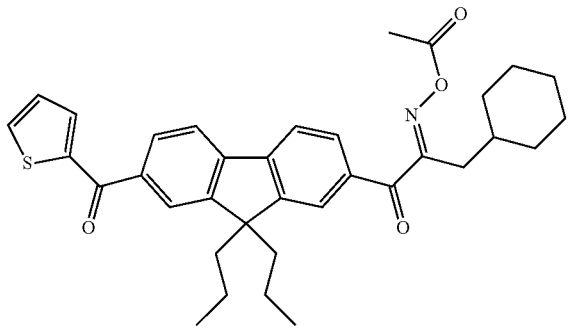
PI-51 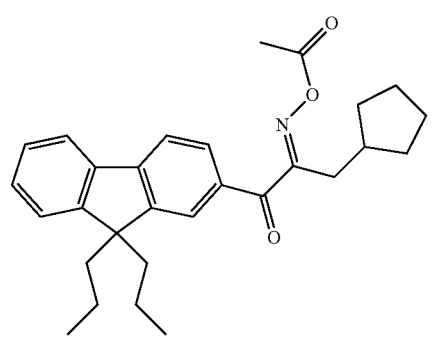
PI-55 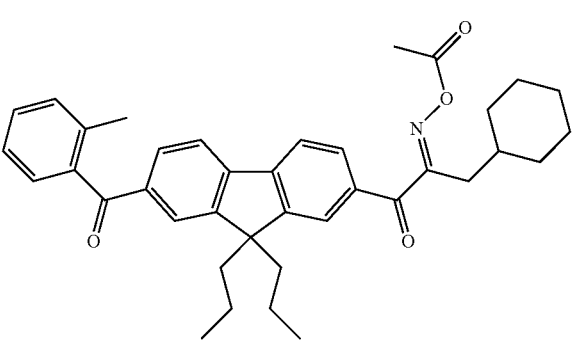

PI-56
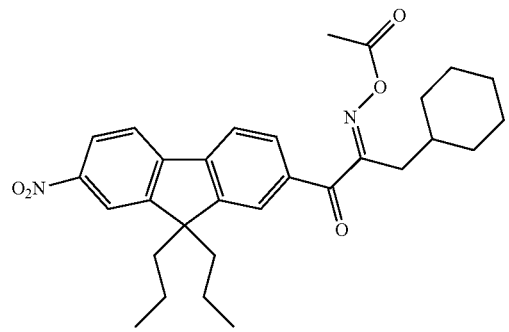
PI-60
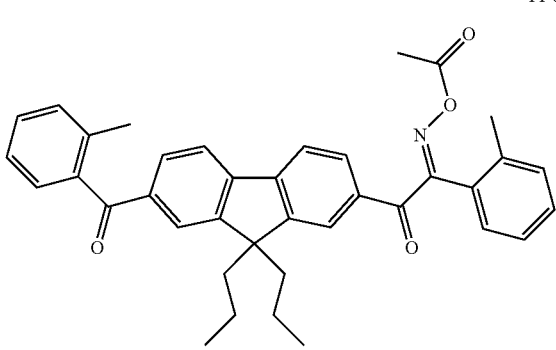
PI-57
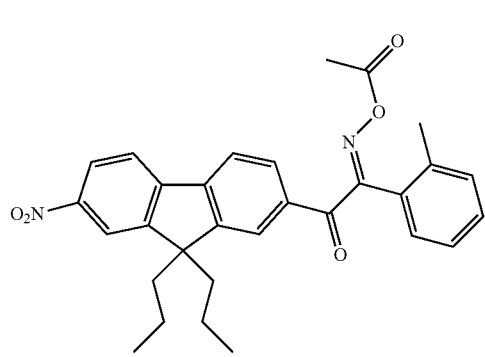
PI-61
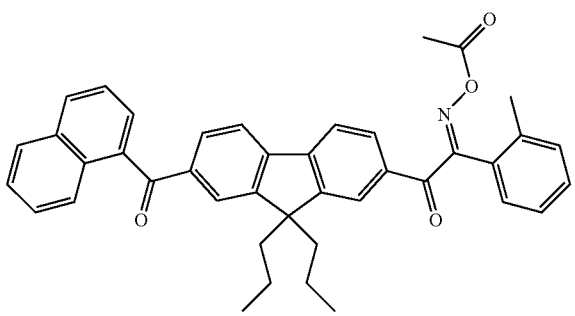
PI-58
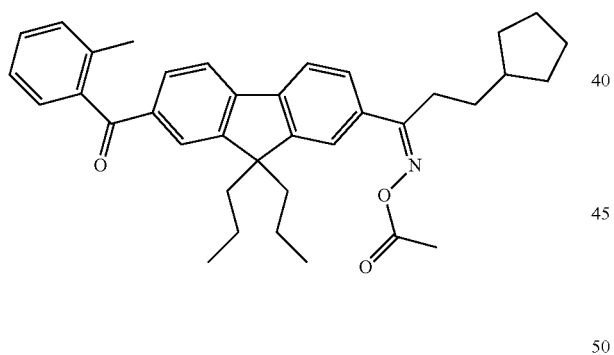
PI-62
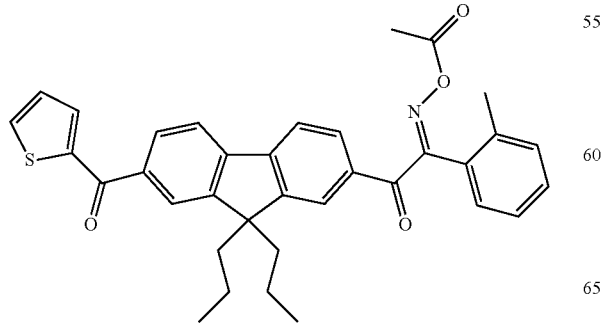
PI-59
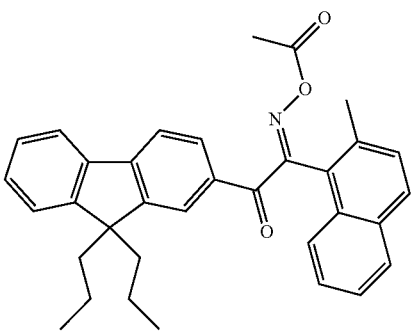
PI-63

PI-64
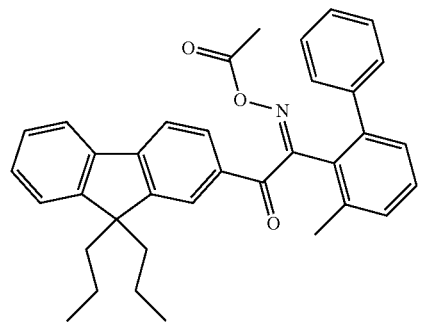
PI-68
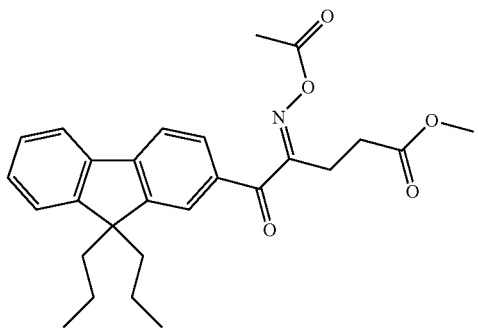
[Chem. 23]
PI-65
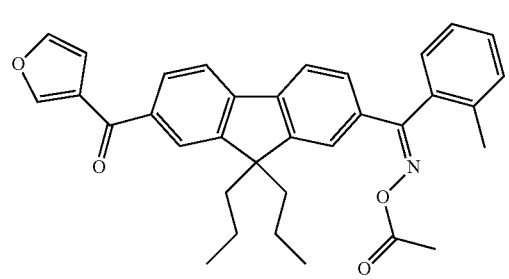
PI-69
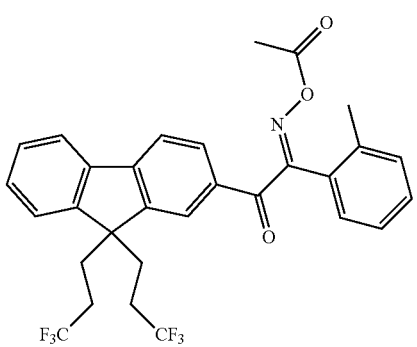
PI-66
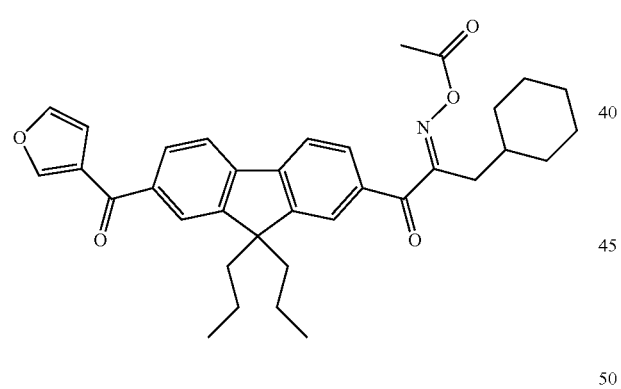
PI-70
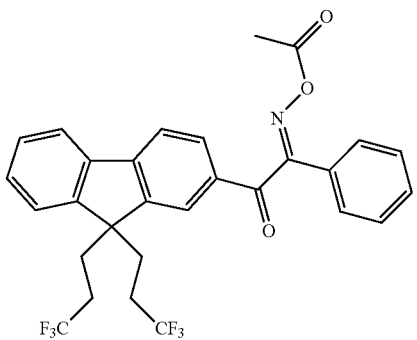
PI-67
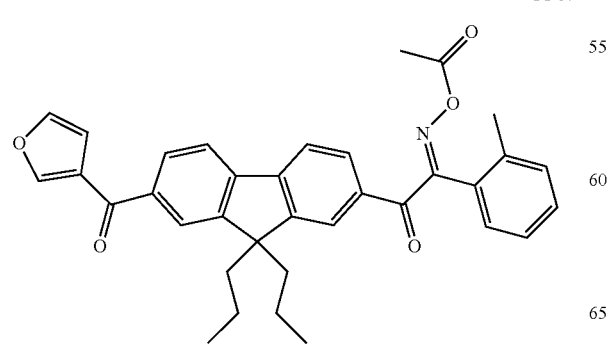
PI-71
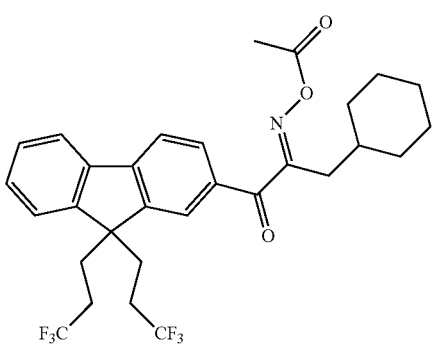

PI-72
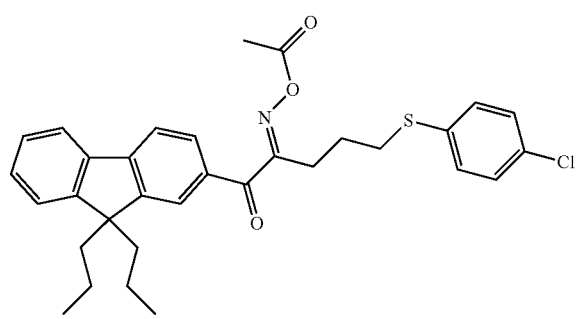
PI-76
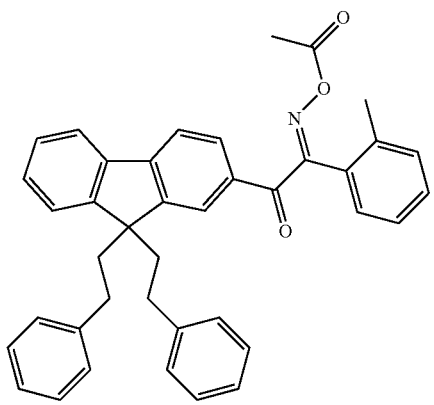
PI-73
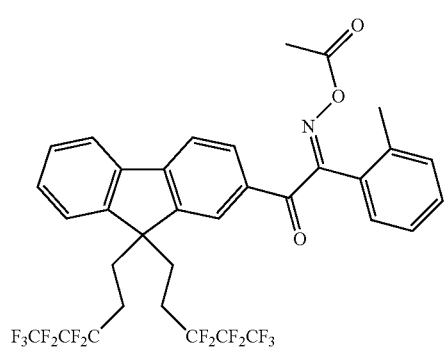
PI-77
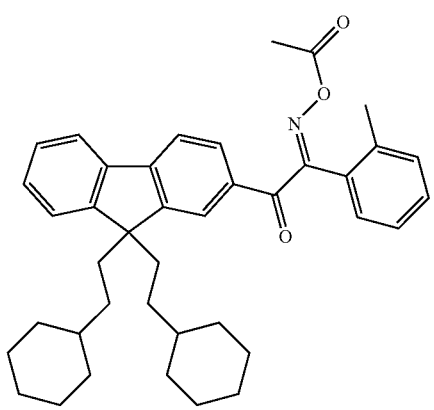
PI-74
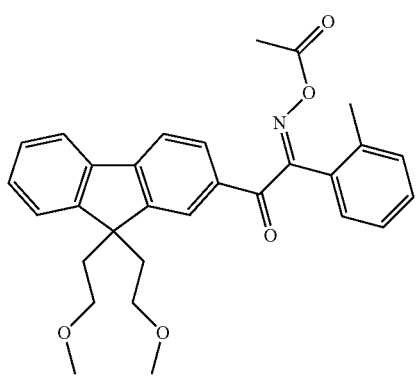
PI-78
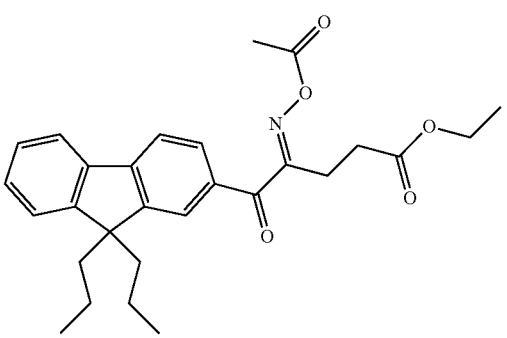
PI-75
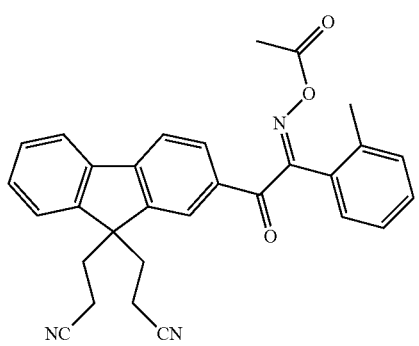
PI-79

-continued

PI-80

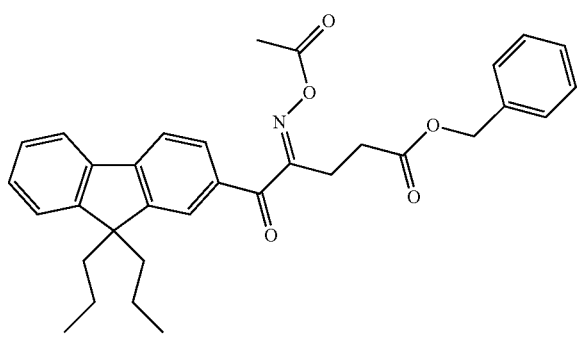

PI-81

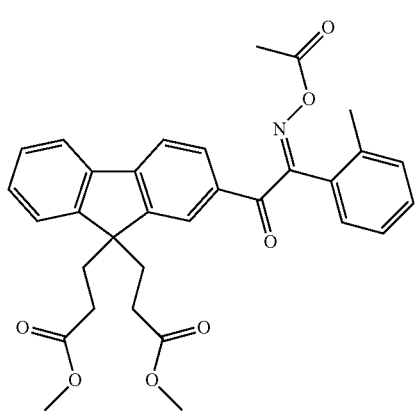

PI-82

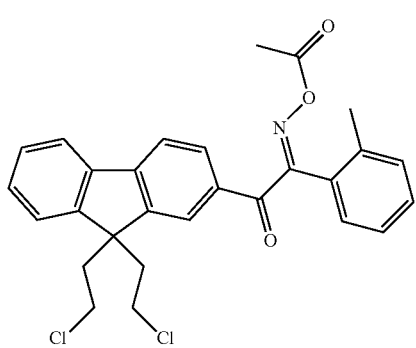

PI-83

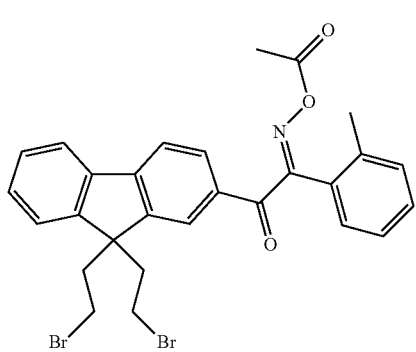

[Other Photopolymerization Initiator (C3)]

As other photopolymerization initiator (C3), 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 2,2-dimethoxy-1,2-diphenylethan-1-one, bis(4-dimethylaminophenyl) ketone, 2-methyl-1-[4-(methylthio)phenyl]-2-morpholinopropan-1-one, 2-benzyl-2-dimethylamino-1-(4-morpholinophenyl)-butan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 4-dimethylamino-2-ethylhexylbenzoic acid, 4-dimethylamino-2-isoamylbenzoic acid, benzyl-β-methoxyethyl acetal, benzyl dimethyl ketal, 1-phenyl-1,2-propanedion-2-(O-ethoxycarbonyl) oxime, methyl o-benzoylbenzoate, 2,4-diethylthioxanthone, 2-chlorothioxanthone, 2,4-dimethylthioxanthone, 1-chloro-4-propoxythioxanthone, thioxanthene, 2-chlorothioxanthene, 2,4-diethylthioxanthene, 2-methylthioxanthene, 2-isopropylthioxanthene, 2-ethylanthraquinone, octamethylanthraquinone, 1,2-benzanthraquinone, 2,3-diphenylanthraquinone, azobisisobutyronitrile, benzoyl peroxide, cumene hydroperoxide, 2-mercaptobenzimidazole, 2-mercaptobenzoxazole, 2-mercaptobenzothiazole, 2-(o-chlorophenyl)-4,5-di(m-methoxyphenyl)-imidazolyl dimer, benzophenone, 2-chlorobenzophenone, p,p'-bisdimethylaminobenzophenone, 4,4'-bisdiethylaminobenzophenone, 4,4'-dichlorobenzophenone, 3,3-dimethyl-4-methoxybenzophenone, benzil, benzoin, benzoin methyl ether, benzoin ethyl ether, benzoin isopropyl ether, benzoin-n-butyl ether, benzoin isobutyl ether, benzoin butyl ether, acetophenone, 2,2-diethoxyacetophenone, p-dimethylacetophenone, p-dimethylaminopropiophenone, dichloroacetophenone, trichloroacetophenone, p-tert-butylacetophenone, p-dimethylaminoacetophenone, p-tert-butyltrichloroacetophenone, p-tert-butyldichloroacetophenone, α,α-dichloro-4-phenoxyacetophenone, thioxanthone, 2-methylthioxanthone, 2-isopropylthioxanthone, dibenzosuberone, pentyl 4-dimethylaminobenzoate, 9-phenylacridine, 1,7-bis-(9-acridinyl)heptane, 1,5-bis-(9-acridinyl)pentane, 1,3-bis-(9-acridinyl)propane, p-methoxytriazine, 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(3-bromo-4-methoxy)styrylphenyl-s-triazine, 2,4-bis-trichloromethyl-6-(2-bromo-4-methoxy)styrylphenyl-s-triazine, and the like are specifically exemplified.

other photopolymerization initiator (C3) may be used either individually or in combination of two or more.

A content of the photopolymerization initiator (C) is preferably 0.5% by mass or more and 30% by mass or less, and more preferably 1% by mass or more and 20% by mass or less relative to the mass of the photosensitive ink composition excluding the mass of the organic solvent (S) described later (total solid content). When the content of the photopolymerization initiator (C) is in the above range, it is possible to obtain the photosensitive ink composition with good curability.

When the photosensitive ink composition includes the phosphine oxide compound (C1) and the oxime ester compound (C2) in combination as the photopolymerization initiator, the ratio of a mass W2 of the oxime ester compound (C2) is preferably 30% by mass or more, more preferably 35% by mass or more and 95% by mass or less, and further preferably 40% by mass or more and 90% by mass or less relative to the sum of the mass W1 of the phosphine oxide compound (C1) and the mass W2 of the oxime ester compound (C2).

The photopolymerization initiator (C) may be used in combination with a photoinitiator aid. Examples of the photoinitiator aid include triethanolamine, methyldiethanolamine, triisopropanolamine, methyl 4-dimethylaminobenzoate, ethyl 4-dimethylaminobenzoate, isoamyl 4-dimethylaminobenzoate, 2-ethylhexyl 4-dimethylaminobenzoate, 2-dimethylaminoethyl 4-dimethylaminobenzoate, N,N-dimethylparatoluidine, 4,4'-bis(dimethylamino)benzophenone, 9,10-dimethoxyanthracene, 2-ethyl-9,10-dimethoxyanthracene, 9,10-diethoxyanthracene, 2-ethyl-9,10-diethoxyanthracene, 2-mercaptobenzothiazole, 2-mercaptobenzoxazole, 2-mercaptobenzimidazole, 2-mercapto-5-methoxybenzothiazole, 3-mercaptopropionic acid, methyl 3-mercaptopropionate, pentaerythritol tetramercaptoacetate, 3-mercaptopropionate, and the like. These photoinitiator aids may be used either individually or in combination of two or more.

[Solvent (S)]

The photosensitive ink composition may include 5% by mass or less of a solvent (S) relative to the mass of the photosensitive ink composition. The type of the solvent (S) is not particularly limited. Typically, the solvent (S) is an organic solvent.

Examples of the organic solvent that can be included in the photosensitive ink composition include (poly)alkylene glycol monoalkyl ethers such as ethylene glycol monomethyl ether, ethylene glycol monoethyl ether, ethylene glycol n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as diethylene glycol dimethyl ether, diethylene glycol methylethyl ether, diethylene glycol diethyl ether, and tetrahydrofuran; ketones such as methyl ethyl ketone, cyclohexanone, 2-heptanone, and 3-heptanone; alkyl lactates such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; and amides such as N-methylpyrrolidone, N,N-dimethylformamide, and N,N-dimethylacetamide.

A content of the solvent (S) in the photosensitive ink composition is not particularly limited as long as the objective of the present invention is not impaired. For example, the content of the solvent (S) in the photosensitive ink composition may be 95% by mass or less, 80% by mass or less, 50% by mass or less, 30% by mass or less, or 20% by mass or less relative to the mass of the photosensitive ink composition.

When the cured product of the photosensitive ink composition is a cured film, this cured film is often used to form a high refractive index film in a display panels such as an organic EL panel. In this case, it is desirable that there is little volatilization of the solvent (S) during the formation of the high refractive index film and little outgassing derived from the solvent (S) remaining in the high refractive index film, in order to avoid damage to the various components that constitutes the display panel. Problems of volatilization of the solvent (S) and outgassing can be solved by reducing the content of the solvent (S) in the photosensitive ink composition. However, when the content of the solvent is reduced in photosensitive compositions and the like, the applicability of the composition is significantly impaired. Particularly, the inkjet method is difficult to apply.

Nevertheless, the photosensitive ink compositions including the aforementioned sulfide compound (A1) and the (meth)acrylate compound (A2) in combination can achieve a low viscosity that is applicable to an inkjet method, even if the photosensitive ink composition includes only a small amount of or no solvent (S).

The viscosity of the photosensitive ink composition is preferably 40 cP or lower, more preferably 30 cP or lower, further preferably 28 cP or lower, and particularly preferably 25 cP or lower as a viscosity measured at 25° C. with an E type viscometer. The viscosity of the photosensitive ink composition can be adjusted by, for example, adjusting a content of the photopolymerizable compound (A), the metal compound particles (B), and the solvent (S).

Due to the above problems related to volatilization of the solvent (S) and outgassing, a content of the solvent (S) in the photosensitive ink composition is preferably 5% by mass or less. Furthermore, the content of the solvent (S) in the photosensitive ink composition is preferably 3% by mass or less, more preferably 2% by mass or less, further preferably 1% by mass or less, even more preferably 0.5% by mass or less, and particularly preferably 0.3% by mass or less. It is most preferable that the photosensitive ink composition include substantially no solvent (s). Inclusion of substantially no solvent (S) in the photosensitive ink composition means that no solvent (S) is intentionally added to the photosensitive ink composition, other than a very small amount of solvent (S) unavoidably brought into the photosensitive ink composition with the raw materials. When the photosensitive ink composition includes substantially no solvent (S), for example, the content of the solvent (S) in the photosensitive ink composition is preferably 0.2% by mass or less, more preferably 0.15% by mass or less, further preferably 0.1% by mass or less, and particularly preferably 0.05% by mass or less.

[Other Component]

The photosensitive ink composition may include various additives conventionally used in photosensitive compositions and ink compositions in addition to the components described above as long as the objective of the present invention is not impaired. Examples of the preferred additives for use in the photosensitive ink composition include a dispersant, an adhesion promoter such as a silane coupling agent, an antioxidant, an anti-cohesion agent, a defoamer, a surfactant, and the like. The surfactant is not particularly limited, and known components such as fluoro-surfactants and silicone-surfactants can be used.

[Method for Producing Photosensitive Ink Composition]

The photosensitive ink composition is obtained by mixing the above-mentioned components in the predetermined quantities and then stirring the mixture uniformly.

<<Method for Producing Cured Product>>

The photosensitive ink composition described above, typically gives the cured product by a method comprising, shaping the photosensitive ink composition according to the shape of the cured product to be formed, and exposing the shaped photosensitive ink composition.

For example, the cured product produced by above method preferably has a refractive index of 1.67 or higher, preferably 1.70 or higher. Therefore, the cured product with such a high refractive index, produced by the above method, is suitably used in optical applications where a high refractive index is required. For example, a film consisting of the cured product of the aforementioned photosensitive ink composition is suitably used as a high refractive index film composing an anti-reflective film and the like in various display panels, such as an organic EL display panel and a liquid crystal display panel.

The thickness of the high refractive index film consisting of the cured product of the aforementioned photosensitive ink composition is not particularly limited, and is selected according to application. Typically, the thickness of the high refractive index film is preferably 1 nm or more and 20 μm or less, and more preferably 50 nm or more and 10 μm or less.

The method of shaping the photosensitive ink composition is not particularly limited and is selected according to the shape of the cured product. The shape of the cured product includes, but is not limited to, a film shape, a lens shape, a line shape, a prism shape, and the like. Among these shapes, the film shape is preferred. The method of shaping the photosensitive ink composition is not particularly limited. When the shape of the cured product is the lens shape, the prism shape, or the like, the photosensitive ink composition may be filled into a mould according to the shape of the cured product using a squeegee and the like. When the shape of the cured product is the line shape and the like, the photosensitive ink composition should be applied on the substrate according to the shape of the cured product. As an application method, for example, printing, such as an inkjet method is exemplified. Examples of the method of applying the photosensitive ink composition in the film shape include methods in which a contact transfer-type applicator such as a roll coater, a reverse coater or a bar coater, and a non-contact type applicator such as a spinner (a rotary applicator), or a curtain flow coater are used. The photosensitive ink composition can also be applied in the form of a film by printing methods such as an inkjet method.

When the photosensitive ink composition includes the solvent (S), the solvent (S) may be removed from the photosensitive ink composition by a method of heating and the like, after shaping the photosensitive ink composition into the desired shape.

For example, after exposure to the photosensitive ink composition shaped into a desired shape, such as a film shape, so that the photosensitive ink composition is not completely cured, it may be shaped to the semi-cured photosensitive ink composition by methods such as imprinting. In this case, the shaped semi-cured photosensitive ink composition is further exposed, and the photosensitive ink composition is sufficiently cured to the desired degree. The aforementioned photosensitive ink composition may also be applied to the 3D printing method to form a cured product of the desired shape by layering a thin film of cured product through repeated inkjet printing and curing by exposure.

As for the exposure method for curing the photosensitive ink composition shaped by the above method, various methods known as curing methods for photosensitive compositions can be applied accordingly. Exposure to the shaped photosensitive ink composition is carried out, for example, by irradiating with active energy rays such as ultraviolet light and excimer laser light.

Exposure to the shaped photosensitive ink composition may be regioselectively carried out, for example by method of exposing through a mask. When the exposure is regioselectively carried out, the patterned cured product is formed by developing the exposed photosensitive ink composition using an organic solvent to remove unexposed areas. When a development process is carried out, it is preferable to remove the developing solution sufficiently after the development, e.g., by drying with heat.

By the method described above, the cured product exhibiting a high refractive index and a high transparency and having desired shape is formed. In addition, the cured product obtained using the aforementioned photosensitive ink composition is suitably used in flexible devices, since they have excellent bending resistance and do not crack when bent. For example, when a 10 μm thick film consisting of the aforementioned cured product is wrapped around a cylindrical stainless steel rod with a radius of 6 mm, preferably 2 mm, no cracking occurs.

EXAMPLES

Hereinafter, the present invention is described in more detail by way of Examples, but the present invention is not limited to these Examples.

Examples 1 to 5 and Comparative Examples 1 to 3

In Examples, a compound having following structure was used as the sulfide compound (A1).

[Chem. 24]

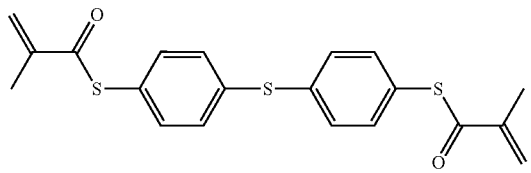

In the Examples and Comparative Examples, a compound having following structure was used as the (meth)acrylate compound (A2).

[Chem. 25]

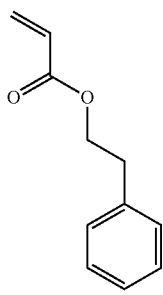

In Examples and Comparative Examples, zirconium oxide particles (average particle diameter: 100 nm) and titanium oxide particles (average particle diameter: 100 nm) were used as the metal compound particles (B).

In Examples and Comparative Examples, the following compounds were used as the phosphine oxide compound.
(C1-1): bis(2,4,6-trimethylbenzoyl)-phenylphosphine oxide
(C1-2): 2,4,6-trimethylbenzoyl-diphenyl-phosphine oxide
(C1-3): ethyl(2,4,6-trimethylbenzoyl)phenylphosphinate In Examples and Comparative Examples, a compound C2-1, a compound C2-2, and a compound C2-3, respectively having the following structure were used as the oxime ester compound (C2). All of the compound C2-1, the compound C2-2, and the compound C2-3 have a peak in a wavelength range of 320 nm or longer and 400 nm or shorter in the absorption spectrum and show a gram absorption coefficient of 10 or more at one or more wavelengths in the wavelength range of 400 nm or longer.

[Chem. 26]

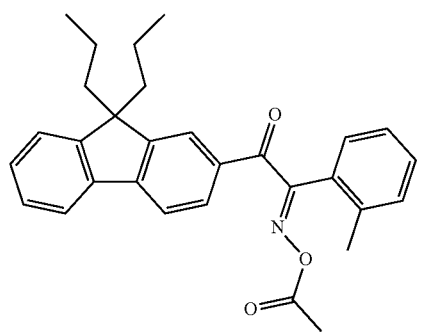

C2-1

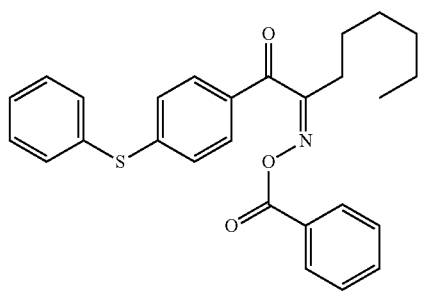

C2-2

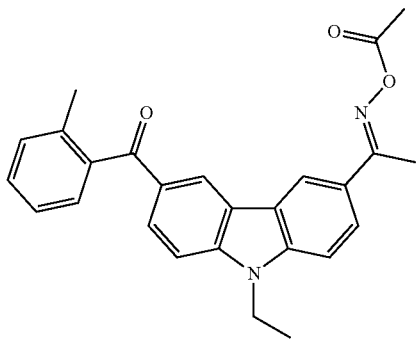

C2-3

In Examples and Comparative Examples, propylene glycol monomethyl ether was used as the solvent (S).

The photosensitive ink compositions of Examples 1 to 5, and Comparative Examples 1 to 3 were obtained by uniformly mixing each of the components described above in the proportions shown in Table 1. Viscosities of the photosensitive ink compositions measured at 25° C. using the E-type viscometer are shown in Table 1. The refractive indexes and the light transmittances of the cured films formed using the obtained photosensitive ink compositions were also measured according to the following method. Results of measurement of refractive index are shown in Table 1.

<Method for Measuring Refractive Index>

The photosensitive ink compositions of each of the Examples and Comparative Examples were applied to a glass substrate using an inkjet system. The coating film was then exposed and cured using a 395 nm UV-LED exposure system with an exposure dose of 2 J/cm$^2$ to obtain a cured film of 3 μm thickness. The refractive indexes at a wavelength of 550 nm of the films were measured using a Metricon prism coupler.

<Method for Measuring Light Transmittance>

The light transmittances of obtained films in measurement of the refractive indexes were measured using a MCPD transmittance meter (manufactured by Otsuka Electronics Co. Ltd.). Based on the light transmittances measured, the light transmittances of the cured product formed by using the photosensitive ink compositions of each of the Examples and Comparative Examples were evaluated according to the following criteria.

Very Good: Light transmittance is 96% or higher.

Good: Light transmittance is 95% or higher and lower than 96%.

Fair: Light transmittance is 93% or higher and lower than 95%.

Poor: Light transmittance is lower than 93%.

TABLE 1

|  |  | Examples | | | | | Comparative Example | | |
| --- | --- | --- | --- | --- | --- | --- | --- | --- | --- |
|  |  | 1 | 2 | 3 | 4 | 5 | 1 | 2 | 3 |
| Photo-polymerizable compound (A) | Sulfide compound (A1) (Parts by mass) | 20 | 10 | 10 | 10 | 10 | 20 | 10 | 10 |
|  | (meth)acrylate compound (A2) (Parts by mass) | 30 | 44 | 44 | 44 | 44 | 30 | 44 | 44 |
| Metal compound particles (B) (Type/Parts by mass) | | $ZrO_2/20$ $TiO_2/25$ | $ZrO_2/44$ | $ZrO_2/44$ | $ZrO_2/44$ | $TiO_2/42$ | $ZrO_2/20$ $TiO_2/25$ | $ZrO_2/44$ | $TiO_2/42$ |
| Photo-polymerization initiator (C) | Phosphine oxide compound (C1) (Type/Parts by mass) | C1-1/2 | C1-1/1 | C1-2/2 | C1-3/2 | C1-1/3 | — | — | — |
|  | Oxime ester compound (C2) (Type/Pats by mass) | C2-1/3 | C2-1/1 | C2-1/3 | C2-1/3 | C2-1/1 | C2-1/5 | C2-2/2 | C2-3/4 |
| Solvent (S) | | 200 | — | — | — | — | 200 | — | — |
| Viscosity (cP, 25° C.) | | 13 | 25 | 20 | 18 | 30 | 13 | 25 | 30 |
| Refractive index of cured product | | 1.74 | 1.71 | 1.70 | 1.70 | 1.76 | 1.74 | 1.71 | 1.76 |
| Light transmittance of cured product | | Very Good | Very Good | Very Good | Very Good | Good | Poor | Poor | Poor |

According to Examples 1 to 5, it is found that the cured product with a high refractive index and a high transparency can be formed, when the photosensitive composition includes the sulfide compound (A1) and the (meth)acrylate compound (A2) respectively having predetermined structure in combination as the photopolymerizable compound (A), and includes the phosphine oxide compound (C1) and the oxime ester compound (C2) in combination as the photopolymerization initiator (C).

According to Comparative Examples 1 to 3, it is found that formation of the cured product with a high refractive index and a high transparency is difficult, when the photosensitive ink composition includes only oxime ester compound (C2) as the photopolymerization initiator, even if the photosensitive ink composition includes the sulfide compound (A1) and the (meth)acrylate compound (A2) respectively having predetermined structure in combination as the photopolymerizable compound (A).

The invention claimed is:

1. A photosensitive ink composition comprising a photopolymerizable compound (A), and a photopolymerization initiator (C), and optionally comprising a solvent(S), wherein the photopolymerizable compound (A) consists of a sulfide compound (A1) represented by the following formula (a-1) and a (meth)acrylate compound (A2) represented by the following formula (a-2), wherein the photopolymerization initiator (C) is a combination of a phosphine oxide compound (C1) and an oxime ester compound (C2), and a ratio of a mass W2 of the oxime ester compound (C2) is 40% by mass or more and 90% by mass or less relative to the sum of a mass W1 of the phosphine oxide compound (C1) and the mass W2 of the oxime ester compound (C2),

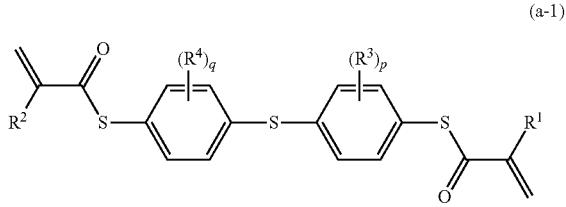
(a-1)

wherein, in the formula (a-1), $R^1$ and $R^2$ are each independently a hydrogen atom or a methyl group, $R^3$ and $R^4$ are each independently an alkyl group having 1 or more and 5 or less carbon atoms, and p and q are each independently 0 or 1:

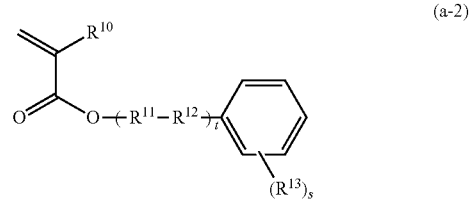
(a-2)

wherein, in the formula (a-2), $R^{10}$ is a hydrogen atom or a methyl group, $R^{11}$ is an alkylene group having 1 or more and 3 or less carbon atoms, $R^{12}$ is a single bond, an oxygen atom, or a sulfur atom, $R^{13}$ is an alkyl group having 1 or more and 4 or less carbon atoms, an alkoxy group having 1 or more and 4 or less carbon atoms, a phenoxy group, or a phenyl group, s is an integer of 0 or more and 5 or less, and t is 0, 1 or 2 wherein the phosphine oxide compound (C1) is selected from the group consisting of bis(2,4,6-trimethylbenzoyl)-phenylphosphine oxide, 2,4,6-trimethylbenzoyl-diphenyl-phosphine oxide, and ethyl(2,4,6-trimethylbenzoyl)phenylphosphinate, and wherein the oxime ester compound (C2) comprises a compound represented by the following formula (C2-1),

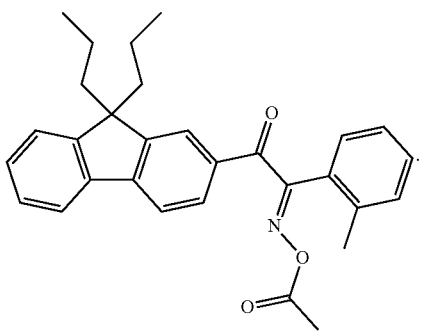

C2-1

2. The photosensitive ink composition according to claim 1, wherein the oxime ester compound (C2) comprises a compound having a peak in a wavelength range of 320 nm or longer and 400 nm or shorter in the absorption spectrum and showing a gram absorption coefficient of 10 or more at one or more wavelengths in the wavelength range of 400 nm or longer.

3. The photosensitive ink composition according to claim 1, wherein a viscosity measured at 25° C. with an E type viscometer is 40 cP or lower.

4. The photosensitive ink composition according to claim 1, further comprising metal compound particles (B) which are at least one selected from the group consisting of zirconium oxide particles, titanium oxide particles, barium titanate particles, cerium oxide particles, and zinc sulfide particles.

5. The photosensitive ink composition according to claim 4, wherein a ratio of a mass of the metal compound particles (B) is 5% by mass or more and 70% by mass or less relative to a mass of the photosensitive ink composition excluding a mass of the solvent (S).

6. The photosensitive ink composition according to claim 1, wherein a ratio of sum of a mass of the sulfide compound (A1) and a mass of the (meth)acrylate compound (A2) is 80% by mass or more relative to a mass of the photopolymerizable compound (A).

7. The photosensitive ink composition according to claim 1 wherein a ratio of a mass of the sulfide compound (A1) is 5% by mass or more and 30% by mass or less relative to a mass of the photosensitive ink composition excluding a mass of the solvent (S).

8. The photosensitive ink composition according to claim 1 wherein a ratio of a mass of the (meth)acrylate compound (A2) is 10% by mass or more and 50% by mass or less relative to a mass of the photosensitive ink composition excluding a mass of the solvent (S).

9. A cured product of the photosensitive ink composition according to claim 1.

10. The cured product according to claim 9, wherein a refractive index is 1.67 or more.

11. A display panel having a film consisting of the cured product of claim 9.

12. A method for producing a cured product comprising:
shaping the photosensitive ink composition according to claim 1 according to the shape of the cured material to be formed; and
exposing the shaped photosensitive ink composition.

13. The method for producing the cured product according to claim 12, wherein the photosensitive ink composition is shaped in a film shape by application.

14. The method for producing the cured product according to claim 13, wherein the application is carried out by an inkjet printing method.

* * * * *